US008728863B2

(12) United States Patent
Nguyen et al.

(10) Patent No.: US 8,728,863 B2
(45) Date of Patent: May 20, 2014

(54) METHODS OF FORMING BONDED SEMICONDUCTOR STRUCTURES INCLUDING INTERCONNECT LAYERS HAVING ONE OR MORE OF ELECTRICAL, OPTICAL, AND FLUIDIC INTERCONNECTS THEREIN, AND BONDED SEMICONDUCTOR STRUCTURES FORMED USING SUCH METHODS

(75) Inventors: Bich-Yen Nguyen, Austin, TX (US); Mariam Sadaka, Austin, TX (US)

(73) Assignee: Soitec, Bernin (FR)

( * ) Notice: Subject to any disclaimer, the term of this patent is extended or adjusted under 35 U.S.C. 154(b) by 16 days.

(21) Appl. No.: 13/206,242

(22) Filed: Aug. 9, 2011

(65) Prior Publication Data

US 2013/0037959 A1    Feb. 14, 2013

(51) Int. Cl.
 *H01L 21/50* (2006.01)
 *H01L 21/48* (2006.01)
 *H01L 21/44* (2006.01)
 *H01L 23/52* (2006.01)
 *H01L 23/48* (2006.01)
 *H01L 23/538* (2006.01)

(52) U.S. Cl.
 USPC .... 438/107; 438/667; 257/774; 257/E23.169; 257/E23.011

(58) Field of Classification Search
 USPC .................. 438/107, 667; 257/774, E23.169, 257/E23.011
 See application file for complete search history.

(56) References Cited

U.S. PATENT DOCUMENTS

| | | |
|---|---|---|
| 6,303,468 B1 | 10/2001 | Aspar et al. |
| 6,335,258 B1 | 1/2002 | Aspar et al. |
| 6,756,286 B1 | 6/2004 | Moriceau et al. |
| 6,809,044 B1 | 10/2004 | Aspar et al. |
| 6,946,365 B2 | 9/2005 | Aspar et al. |
| RE39,484 E | 2/2007 | Bruel |
| 2005/0094926 A1 | 5/2005 | Dominic et al. |
| 2005/0100345 A1 | 5/2005 | Welch et al. |
| 2005/0108664 A1 | 5/2005 | Johnston |
| 2005/0111848 A1 | 5/2005 | Grubb |

(Continued)

OTHER PUBLICATIONS

French Preliminary Search Report and Opinion for French Application No. FR1157426 dated May 8, 2012, 9 pages.

(Continued)

*Primary Examiner* — Luan C Thai
(74) *Attorney, Agent, or Firm* — TraskBritt

(57) ABSTRACT

Methods of forming bonded semiconductor structures include providing a substrate structure including a relatively thinner layer of material on a thicker substrate body, and forming a plurality of through wafer interconnects through the layer of material. A first semiconductor structure may be bonded over the thin layer of material, and at least one conductive feature of the first semiconductor structure may be electrically coupled with at least one of the through wafer interconnects. A transferred layer of material may be provided over the first semiconductor structure on a side thereof opposite the first substrate structure, and at least one of an electrical interconnect, an optical interconnect, and a fluidic interconnect may be formed in the transferred layer of material. A second semiconductor structure may be provided over the transferred layer of material on a side thereof opposite the first semiconductor structure. Bonded semiconductor structures are fabricated using such methods.

28 Claims, 16 Drawing Sheets

(56) References Cited

U.S. PATENT DOCUMENTS

| | | |
|---|---|---|
| 2005/0129350 A1 | 6/2005 | Welch |
| 2005/0135729 A1 | 6/2005 | Welch |
| 2005/0135731 A1 | 6/2005 | Welch |
| 2005/0169640 A1 | 8/2005 | Grubb |
| 2005/0213883 A1 | 9/2005 | Welch |
| 2005/0269680 A1* | 12/2005 | Hsuan .................. 257/686 |
| 2006/0018587 A1 | 1/2006 | Lakshminarayana |
| 2006/0062519 A1 | 3/2006 | Kish |
| 2006/0093369 A1 | 5/2006 | Nagarajan |
| 2006/0159387 A1 | 7/2006 | Handelman |
| 2006/0159411 A1 | 7/2006 | Miller |
| 2006/0182441 A1 | 8/2006 | Kish |
| 2006/0228067 A1 | 10/2006 | Joyner |
| 2006/0239612 A1 | 10/2006 | DeDobbelaere |
| 2006/0245754 A1 | 11/2006 | Valette |
| 2006/0251426 A1 | 11/2006 | Mazed |
| 2007/0019901 A1 | 1/2007 | Kish |
| 2007/0086702 A1 | 4/2007 | Peters |
| 2007/0172169 A1 | 7/2007 | Kish |
| 2007/0183737 A1 | 8/2007 | Joyner |
| 2007/0183738 A1 | 8/2007 | Welch |
| 2007/0222065 A1* | 9/2007 | Andry et al. .................. 257/723 |
| 2007/0242919 A1 | 10/2007 | Welch |
| 2007/0248299 A1 | 10/2007 | Welch |
| 2007/0269160 A1 | 11/2007 | Handelman |
| 2007/0269214 A1 | 11/2007 | Handelman |
| 2007/0269220 A1 | 11/2007 | Handelman |
| 2007/0269221 A1 | 11/2007 | Handelman |
| 2007/0274630 A1 | 11/2007 | Ghiron |
| 2008/0013881 A1 | 1/2008 | Welch |
| 2008/0025726 A1 | 1/2008 | Welch |
| 2008/0031626 A1 | 2/2008 | Welch |
| 2008/0037928 A1 | 2/2008 | Handelman |
| 2008/0138088 A1 | 6/2008 | Welch |
| 2009/0022452 A1 | 1/2009 | Welch |
| 2009/0092354 A1 | 4/2009 | Joyner |
| 2009/0154917 A1 | 6/2009 | Handelman |
| 2009/0202196 A1 | 8/2009 | Kish, Jr. |
| 2009/0220191 A1 | 9/2009 | Evans |
| 2009/0238557 A1 | 9/2009 | Chen et al. |
| 2009/0245719 A1 | 10/2009 | Nagarajan |
| 2009/0245795 A1 | 10/2009 | Joyner |
| 2009/0257706 A1 | 10/2009 | Rasras |
| 2009/0294954 A1 | 12/2009 | Bakir et al. |
| 2009/0317033 A1 | 12/2009 | Shih |
| 2010/0183043 A1 | 7/2010 | Rigole et al. |
| 2010/0247028 A1 | 9/2010 | Nagarajan |
| 2010/0254420 A1 | 10/2010 | Corzine |
| 2010/0290735 A1 | 11/2010 | Joyner |
| 2011/0121366 A1 | 5/2011 | Or-Bach et al. |

OTHER PUBLICATIONS

Bakir et al., 3D Heterogeneous Integrated Systems: Liquid Cooling, Power Delivery, and Implementation, IEEE 2008 Custom Intergrated Circuits Conference (CICC), pp. 663-670.

Bakir et al., Electrical, Optical, and Fluidic Interconnect Networks for 3D Heterogeneous Integrated Systems, IEEE 2008, 978-1-4244-1920-3, pp. 7-8.

Bakir et al., Revolutionary NanoSilicon Ancillary Technologies for Ultimate-Performance Gigascale Systems, IEEE 2007 Custom Intergrated Circuits Conference (CICC), pp. 421-428.

King, Jr. et al., 3D Stacking of Chips with Electrical and Microfluidic I/O Interconnects, 2008 Electronic Components and Technology Conference, pp. 1-7.

Liu et al., Ge-on-Si Laser Operating at Room Temperature, Optics Letters, Vo. 35, No. 5, Mar. 1, 2010, pp. 679-681.

Leduc et al., First Integration of Cu TSV Using Die-to-Wafer Direct Bonding and Planarization, 3D System Integration, 2009. 3DIC 2009. IEEE International Conference, Sep. 28-30, 2009, 5 pages.

Optoiq, Silicon Photonics: Ge-on-Si Emitter Moves Silicon Photonics Ahead, Jun. 1, 2009, 3 pages.

Sadaka et al., U.S. Appl. No. 12/837,326 entitled Methods of Forming Bonded Semiconductor Structures, and Semiconductor Structures Formed by Such Methods, filed Jul. 15, 2010.

Sun et al., Electrically Pumped Hybrid Evanescent Si/InGaAsP Lasers, Optics Letters, vol. 34, No. 9, May 1, 2009, pp. 1345-1347.

Sun et al., Room-Temperature Direct Bandgap Electroluminescence from Ge-on-Si Light-Emitting Diodes, Optics Letters, vol. 34, No. 8, Apr. 15, 2009, pp. 1198-1200.

* cited by examiner

METHODS OF FORMING BONDED SEMICONDUCTOR STRUCTURES INCLUDING INTERCONNECT LAYERS HAVING ONE OR MORE OF ELECTRICAL, OPTICAL, AND FLUIDIC INTERCONNECTS THEREIN, AND BONDED SEMICONDUCTOR STRUCTURES FORMED USING SUCH METHODS

TECHNICAL FIELD

The present invention relates to methods of forming bonded semiconductor structures using three-dimensional integration (3D) techniques, and to bonded semiconductor structures formed by such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou et al., "The Handbook of 3D Integration," Wiley-VCH (2008).

The 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermocompression bonding" methods are direct bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation. After providing the two surfaces in direct physical contact, a bonding wave may be initiated at and propagated along the interface between two abutting surfaces. A direct chemical bond is established between the two abutting surfaces at the wave front as the wave front spreads across the bonding interface between the two abutting surfaces.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve a suitable bond strength at the bonding interface. Ultra-low temperature direct bonding methods in which pressure is applied between the bonding surfaces are often referred to in the art as "surface assisted bonding" or "SAB" methods. Thus, as used herein, the terms "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

BRIEF SUMMARY

This summary is provided to introduce a selection of concepts in a simplified form. These concepts are described in further detail in the detailed description of example embodiments of the invention below. This summary is not intended to identify key features or essential features of the claimed subject matter, nor is it intended to be used to limit the scope of the claimed subject matter.

In some embodiments, the present invention includes methods of forming bonded semiconductor structures. In accordance with such methods, a substrate structure may be provided that includes a relatively thin layer of material on a relatively thick substrate body. A plurality of through wafer interconnects may be formed through the relatively thin layer of material of the first substrate structure. A first processed semiconductor structure may be bonded over the relatively thin layer of material of the first substrate structure on a side thereof opposite the relatively thick substrate body, and at least one conductive feature of the first processed semiconductor structure may be electrically coupled with at least one through wafer interconnect of the plurality of through wafer interconnects. A transferred layer of material may be provided over the first processed semiconductor structure on a side thereof opposite the first substrate structure. At least one of an electrical interconnect, an optical interconnect, and a fluidic interconnect may be formed in the transferred layer of material. A second processed semiconductor structure may be provided over the transferred layer of material on a side thereof opposite the first processed semiconductor structure. The relatively thick substrate body of the substrate structure may be removed, leaving the relatively thin layer of material of the substrate structure bonded to the first processed semiconductor structure. At least one through wafer interconnect of the plurality of through wafer interconnects may be electrically coupled to a conductive feature of another structure.

In additional embodiments, the present invention includes bonded semiconductor structures fabricated using methods described herein. For example, in some embodiments, the present invention includes bonded semiconductor structures that comprise a substrate structure, a plurality of processed semiconductor structures, and a transferred layer of material over the plurality of processed semiconductor structures on a side thereof opposite the substrate structure. The substrate structure includes a plurality of through wafer interconnects extending through a relatively thin layer of material, and a relatively thick substrate body bonded to the layer of material. The plurality of processed semiconductor structures are electrically coupled to the plurality of through wafer interconnects on a side of the relatively thin layer of material opposite the relatively thick substrate body. At least one of an electrical interconnect, an optical interconnect, and a fluidic interconnect is disposed in the transferred layer of material.

BRIEF DESCRIPTION OF THE DRAWINGS

While the specification concludes with claims particularly pointing out and distinctly claiming what are regarded as embodiments of the invention, the advantages of embodiments of the invention may be more readily ascertained from the description of certain examples of embodiments of the invention when read in conjunction with the accompanying drawings, in which:

DETAILED DESCRIPTION

Figure 1A:
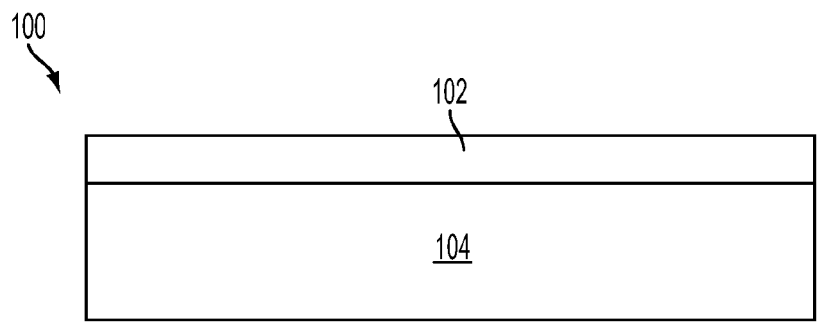
FIGS. 1A through 1K are simplified cross-sectional views of semiconductor structures and depict the formation of an intermediate structure that may be formed during fabrication of bonded semiconductor structures in accordance with example embodiments of the invention.

The illustrations presented herein are not meant to be actual views of any particular semiconductor structure, device, system, or method, but are merely idealized representations that are used to describe embodiments of the invention.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "electrical interconnect" means and includes any conductive feature in a semiconductor structure that is used to electrically interconnect at least two device structures in the semiconductor structure by providing at least a portion of an electrical current pathway between the at least two device structures.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis). Through wafer interconnects are a type of electrical interconnect.

As used herein, the term "optical interconnect" means and includes any feature in a semiconductor structure that is used to provide a pathway that is conductive to electromagnetic radiation at one or more wavelengths between at least two optical device structures in the semiconductor structure. Although the term "optical" is used, optical interconnects may be used to provide a pathway for one or more wavelengths of electromagnetic radiation, which wavelengths may be within or outside the visible region of the electromagnetic radiation spectrum (e.g., within one or both of the visible region and the infrared region of the electromagnetic radiation spectrum).

As used herein, the term "fluidic interconnect" means and includes any feature in a semiconductor structure that is used to provide a portion of a fluid pathway or passageway that is used to convey a fluid through at least a portion of the semiconductor structure. For example, a fluidic interconnect may comprise a first section of a fluid passageway that interconnects a second section of the fluid passageway with a third section of the fluid passageway.

In accordance with some embodiments of the invention, a recoverable substrate structure may be temporarily bonded to a semiconductor structure and utilized in the formation of a bonded semiconductor structure. The recoverable substrate structure may be removed from the semiconductor structure after processing the semiconductor structure to form the bonded semiconductor structure. The processing may include providing a transferred layer of material on the semiconductor structure, forming at least one of an electrical interconnect, an optical interconnect, and a fluidic interconnect in the transferred layer of material, and bonding another processed semiconductor structure over the transferred layer of material.

Figure 1B:
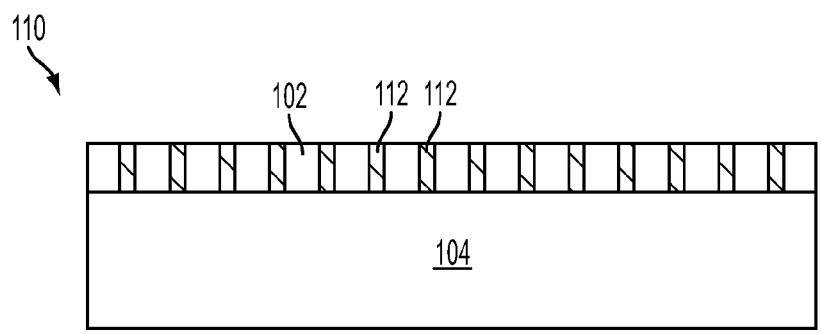
Figure 1C:
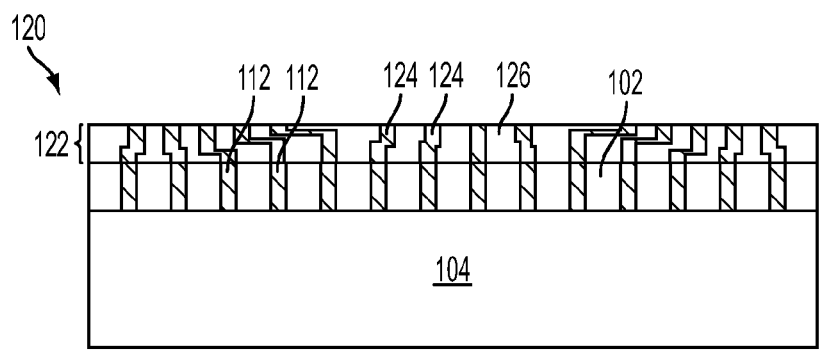

FIGS. 1A through 1C illustrate the fabrication of a substrate structure 120 (FIG. 1C) that may be employed in some embodiments of the invention. Referring to FIG. 1A, a substrate structure 100 is provided that includes a relatively thin layer of material 102 on a relatively thick substrate body 104. In some embodiments, the substrate structure 100 may comprise a wafer-scale substrate having an average diameter of several hundred millimeters or more. By way of example and not limitation, the relatively thin layer of material 102 may have an average thickness of about twenty microns (20 µm) or less, about two microns (2.0 µm) or less, about one and one-half microns (1.5 µm) or less, or even about 1 micron (1 µm) or less. The relatively thick substrate body 104 may have an average thickness of, for example, between about six hundred microns (600 µm) and several centimeters.

The relatively thin layer of material 102 may comprise a semiconductor material such as, for example, silicon or germanium. Such a semiconductor material may be polycrystalline or at least substantially comprised of single crystal material, and may be doped or undoped. In additional embodiments, the relatively thin layer of material 102 may comprise a ceramic material, such as an oxide (e.g., silicon oxide ($SiO_2$), aluminum oxide ($Al_2O_3$), etc.), a nitride (e.g., silicon nitride ($Si_3N_4$), boron nitride (BN), etc.), or an oxynitride (e.g., silicon oxynitride (SiON)).

The relatively thick substrate body 104 may have a composition different from that of the relatively thin layer of material 102, but may itself comprise a semiconductor material or a ceramic material as mentioned in relation to the thin layer of material 102. In additional embodiments, the relatively thick substrate body 104 may comprise a metal or metal alloy.

In some embodiments, the relatively thin layer of material 102 may be temporarily attached to the relatively thick substrate body 104 using temporary bonding techniques such as those disclosed in U.S. patent application Ser. No. 12/837, 326, which was filed Jul. 15, 2010 in the name of Sadaka et al., now U.S. Pat. No. 8,841,406, which issued Jul. 9, 2013, and is incorporated herein in its entirety by this reference.

The relatively thick substrate body 104 may comprise a recoverable and reusable portion of the substrate structure 100, as discussed in further detail below.

Referring to FIG. 1B, a plurality of through wafer interconnects 112 may be formed through the relatively thin layer of material 102 to form the substrate structure 110 of FIG. 1B. Various processes for forming through wafer interconnects 112 are known in the art and may be employed in embodiments of the present invention. As a non-limiting example, a patterned mask layer may be provided over the exposed major surface of the thin layer of material 102. The patterned mask layer may include apertures extending therethrough at the locations at which it is desired to form the through wafer interconnects 112 through the thin layer of material 102. An etching process (e.g., an anisotropic wet chemical etching process or an anisotropic dry reactive ion etching process) then may be used to etch via holes through the thin layer of material 102. After forming the via holes, the patterned mask layer may be removed, and the via holes may be filled with one or more conductive metals or metal alloys (e.g., copper or a copper alloy) to form the through wafer interconnects 112. For example, one or more of a physical vapor deposition (PVD) process, a chemical vapor deposition (CVD) process, an electroless plating process, and an electrolytic plating process may be used to provide the conductive material in the via holes. After depositing or otherwise providing the conductive material in the via holes, an etching or polishing process may be used to remove any conductive material present over the surface of the thin layer of material 102 to form the through wafer interconnects 112.

After forming the plurality of through wafer interconnects 112 through the relatively thin layer of material 102, one or more redistribution layers (RDLs) 122 optionally may be formed over the thin layer of material 102 on a side thereof opposite the relatively thick substrate body 104 to form the substrate structure 120 shown in FIG. 1C. As known in the art, redistribution layers may be used to redistribute the locations of electrical features of a first structure or device so as to accommodate a pattern of conductive features on another structure or device to be coupled thereto. In other words, a redistribution layer may have a first pattern of conductive features on a first side of the redistribution layer and a second, different pattern of conductive features on an opposing second side of the redistribution layer, wherein the conductive features on the first side are electrically interconnected through the redistribution layer with respectively corresponding conductive features on the opposing second side.

As shown in FIG. 1C, the redistribution layer 122 may comprise a plurality of conductive features 124 that are disposed within and surrounded by a dielectric material 126. The conductive features 124 may include one or more of conductive pads, laterally extending conductive lines or traces, and vertically extending conductive vias. Furthermore, the redistribution layer 122 may comprise a plurality of layers formed sequentially one over another, each layer comprising conductive features 124 and dielectric material 126, and the conductive features 124 of one layer may be in direct physical and electrical contact with conductive features 124 in adjacent layers, such that the conductive features 124 of the redistribution layer 122 extend continuously through the dielectric material 126 from one side of the redistribution layer 122 to the opposing side of the redistribution layer 122. On the side of the redistribution layer 122 adjacent the relatively thin layer of material 102 and the through wafer interconnects 112, the conductive features 124 of the redistribution layer 122 may be disposed in a pattern that is complementary to a pattern in which the through wafer interconnects 112 are disposed, such that the through wafer interconnects 112 are in direct physical and electrical contact with corresponding conductive features 124 of the redistribution layer 122. The pattern of the conductive features 124 of the redistribution layer 122 may be redistributed across the thickness of the redistribution layer 122 from one side thereof to the other, as described above.

Figure 1D:
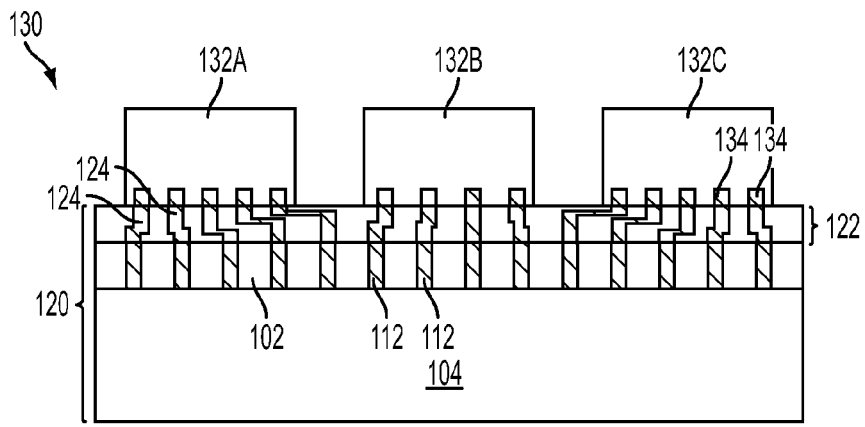

Referring to FIG. 1D, after forming the redistribution layer 122, at least one processed semiconductor structure 132A may be bonded over the relatively thin layer of material 102 of the substrate structure 120 on a side thereof opposite the relatively thick substrate body 104 to form the structure 130 of FIG. 1D. For example, the at least one processed semiconductor structure 132A may be bonded directly to the redistribution layer 122, as shown in FIG. 1D.

In some embodiments, a plurality of processed semiconductor structures 132A, 132B, 132C may be bonded to the redistribution layer 122 over the relatively thin layer of material 102 of the substrate structure 120 on a side thereof opposite the relatively thick substrate body 104, as shown in FIG. 1D. The plurality of processed semiconductor structures 132A, 132B, 132C may be disposed laterally beside one another along a common plane oriented parallel to a major surface of the first substrate structure 120, as shown in FIG. 1D. In other words, each of the plurality of processed semiconductor structures 132A, 132B, 132C may occupy a different area over the substrate structure 120, and may be positioned such that a plane may be drawn parallel to a major surface of the first substrate structure 120 that passes through each of the processed semiconductor structures 132A, 132B, 132C.

The one or more processed semiconductor structures 132A, 132B, 132C may comprise, for example, semiconductor dies, and may include one or more of electronic signal processors, memory devices, and optoelectronic devices (e.g., light-emitting diodes, lasers, photodiodes, solar cells, etc.).

In bonding the processed semiconductor structures 132A, 132B, 132C to the substrate structure 120, conductive features 134 of the processed semiconductor structures 132A, 132B, 132C may be electrically coupled with the conductive features 124 of the redistribution layer 122 and the through wafer interconnects 112 extending through the relatively thin layer of material 102.

The bonding process used to bond the processed semiconductor structures 132A, 132B, 132C to the substrate structure 120 may be performed at a temperature or temperatures of about 400° C. or less. In some embodiments, the processed semiconductor structures 132A, 132B, 132C may be bonded to the substrate structure 120 using a thermocompression, or a non-thermocompression direct bonding process, performed at a temperature or temperatures of about 400° C. or less. In some embodiments, the processed semiconductor structures 132A, 132B, 132C may be bonded to the substrate structure 120 using an ultra-low temperature direct bonding process performed at a temperature or temperatures of about 200° C. or less. In some instances, the bonding process may be performed at about room temperature. Performing the bonding process at such lower temperatures may avoid unintentional damage to device structures in the processed semiconductor structures 132A, 132B, 132C. Additionally, the bonding process may comprise a surface-assisted bonding process in some embodiments. The direct bonding process may comprise an oxide-to-oxide (e.g., silicon dioxide-to-silicon dioxide) direct bonding process, and/or a metal-to-metal (e.g., copper-to-copper) direct bonding process.

In some embodiments, additional processed semiconductor structures may be stacked over and electrically and physically coupled with the processed semiconductor structures 132A, 132B, 132C using one or more three-dimensional (3D) integration processes. Examples of such processes are described below with reference to FIGS. 1E through 1H.

Figure 1E:
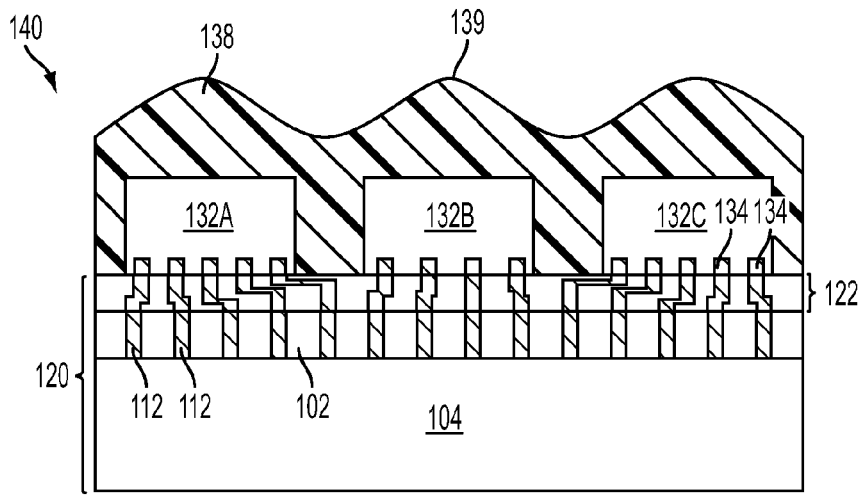

Referring to FIG. 1E, after bonding the processed semiconductor structures 132A, 132B, 132C to the substrate structure 120, a dielectric material 138 may be deposited over and around the processed semiconductor structures 132A, 132B, 132C to form the structure 140 of FIG. 1E. The dielectric material 138 may comprise, for example, a polymer material or an oxide material (e.g., silicon oxide), and may be deposited using, for example, a spin-on process or a chemical vapor deposition (CVD) process. An oxide material that may be deposited with low stress and at a relatively high deposition rate may be desirable. The oxide material may have a composition that will not be degraded by subsequent processing (e.g., anneals carried out at temperatures of up to 400° C.). By way of example and not limitation, in some embodiments, the dielectric material 138 may comprise an oxide layer having a thickness of about thirty microns (30 μm) deposited using a plasma enhanced chemical vapor deposition (PECVD) process at a temperature of about 400° C. The oxide layer may be deposited at a rate of between about 1.8 and about 3.0 microns per minute. The residual stress in such a deposited film may be as low as about 15 MPa.

The dielectric material 138 may be deposited in a conformal manner over the structure 130 of FIG. 1D such that the exposed major surface 139 of the dielectric material 138 comprises peaks and valleys. The peaks may be located over the processed semiconductor structures 132A, 132B, 132C, and the valleys may be located over the regions between the processed semiconductor structures 132A, 132B, 132C, as shown in FIG. 1E.

Figure 1F:
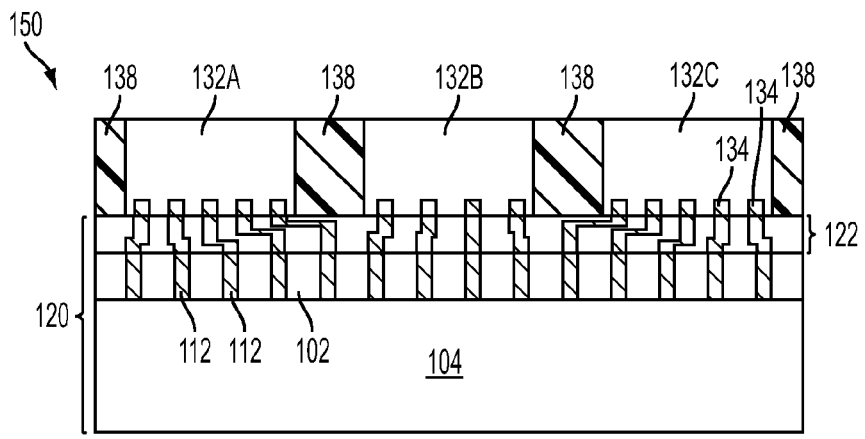

Referring to FIG. 1F, the exposed major surface 139 of the dielectric material 138 may be planarized, and a portion of the dielectric material 138 may be removed to expose the processed semiconductor structures 132A, 132B, 132C through the dielectric material 138 and form the structure 150 shown in FIG. 1F. For example, a chemical etching process (wet or dry), a mechanical polishing process, or a chemical-mechanical polishing (CMP) process may be used to planarize the major surface 139 of the dielectric material 138, remove a portion of the dielectric material 138, and expose the processed semiconductor structures 132A, 132B, 132C through the dielectric material 138.

Figure 1G:
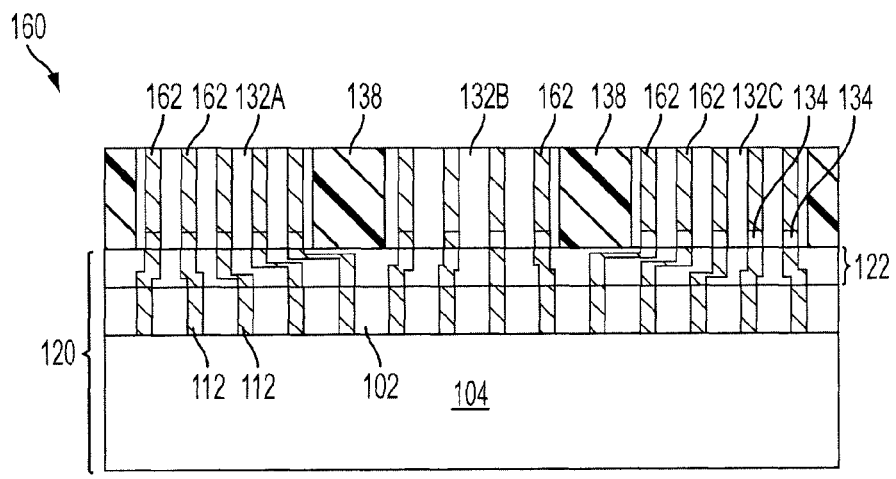

As shown in FIG. 1G, an additional plurality of through wafer interconnects 162 may be formed at least partially through the processed semiconductor structures 132A, 132B, 132C to form the structure 160. The additional through wafer interconnects 162 may be formed through the processed semiconductor structures 132A, 132B, 132C from the exposed major surfaces thereof to conductive features 134 within the processed semiconductor structures 132A, 132B, 132C. The through wafer interconnects 162 may be formed as previously described in relation to the formation of the through wafer interconnects 112. The processes, however, may be limited to temperatures of about 400° C. or less to avoid damaging device structures within the processed semiconductor structures 132A, 132B, 132C.

Figure 1H:
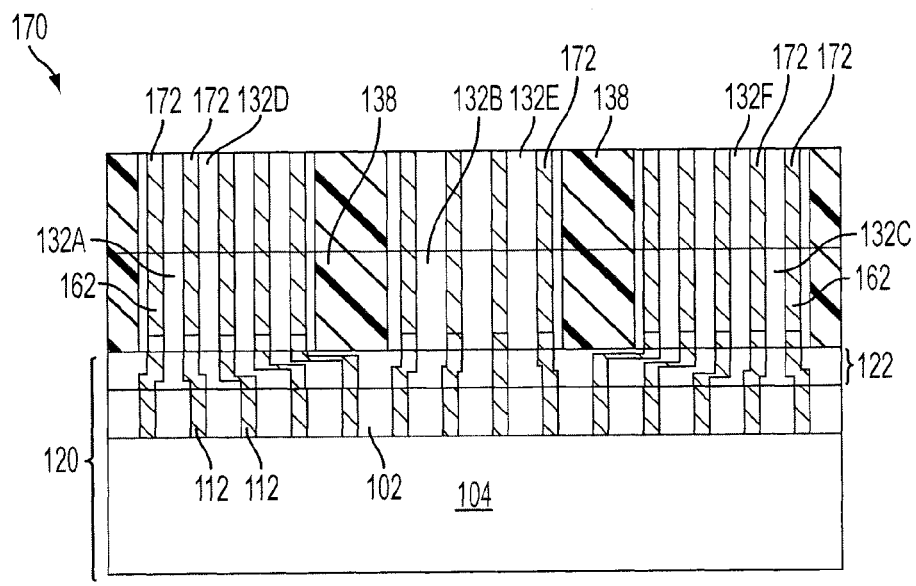

Referring to FIG. 1H, after forming the additional through wafer interconnects 162, the processes described above in relation to FIGS. 1D through 1G may be used to provide additional processed semiconductor structures 132D, 132E, 132F vertically over the processed semiconductor structures 132A, 132B, 132C and form the bonded semiconductor structure 170 shown in FIG. 1H. As an example, a processed semiconductor structure 132D may be directly bonded to the processed semiconductor structure 132A, a processed semiconductor structure 132E may be directly bonded to the processed semiconductor structure 132B, and a processed semiconductor structure 132F may be directly bonded to the processed semiconductor structure 132C. These bonding processes may be limited to temperatures of about 400° C. or less to avoid damaging device structures within the processed semiconductor structures 132A-132F, and may comprise a thermocompression direct bonding, a non-thermocompression bonding process, or an ultra-low temperature direct bonding process. Further, in some embodiments, the direct bonding processes may comprise surface-assisted bonding processes.

In this configuration, the processed semiconductor structures 132D, 132E, 132F are respectively disposed vertically over the processed semiconductor structures 132A, 132B, 132C along lines oriented perpendicular to the major surfaces of the first substrate structure 120. For example, the processed semiconductor structure 132A and the processed semiconductor structure 132D are disposed vertically over one another along a common line oriented perpendicular to the major surfaces of the first substrate structure 120. In other words, the processed semiconductor structure 132A and the processed semiconductor structure 132D are disposed such that a common line may be drawn perpendicular to the major surfaces of the first substrate structure 120 through each of the processed semiconductor structure 132A and the processed semiconductor structure 132D.

After bonding the processed semiconductor structures 132D, 132E, 132F to the processed semiconductor structures 132A, 132B, 132C, additional through wafer interconnects 172 may be formed at least partially through the processed semiconductor structures 132D, 132E, 132F. The additional through wafer interconnects 172 may be formed through the processed semiconductor structures 132D, 132E, 132F from the exposed major surfaces thereof to the through wafer interconnects 162 or other conductive features of the processed semiconductor structures 132A, 132B, 132C. The through wafer interconnects 172 may be formed as previously described in relation to the formation of the through wafer interconnects 112. The processes, however, may be limited to temperatures of about 400° C. or less to avoid damaging device structures within the processed semiconductor structures 132A-132F.

The processes described above in relation to FIGS. 1D through 1G may be repeated one or more additional times as desired to vertically integrate any number of additional layers of processed semiconductor structures over the processed semiconductor structures 132A-132F in a three-dimensional (3D) integration process.

After forming the bonded semiconductor structure 170 of FIG. 1H, a transferred layer of material 212 (FIG. 1K) may be provided over the processed semiconductor structures 132A-132F on a side thereof opposite the substrate structure 120. Examples of methods that may be used to provide the transferred layer of material 212 (FIG. 1K) over the processed semiconductor structures 132A-132F are described below with reference to FIGS. 1I through 1K.

Figure 1I:
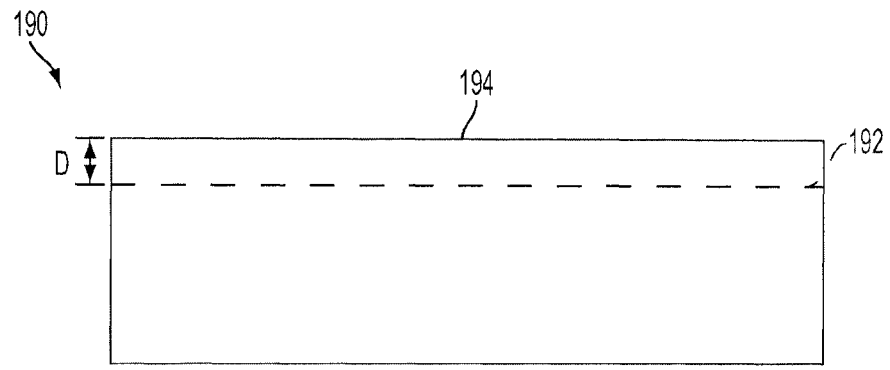
Figure 1J:
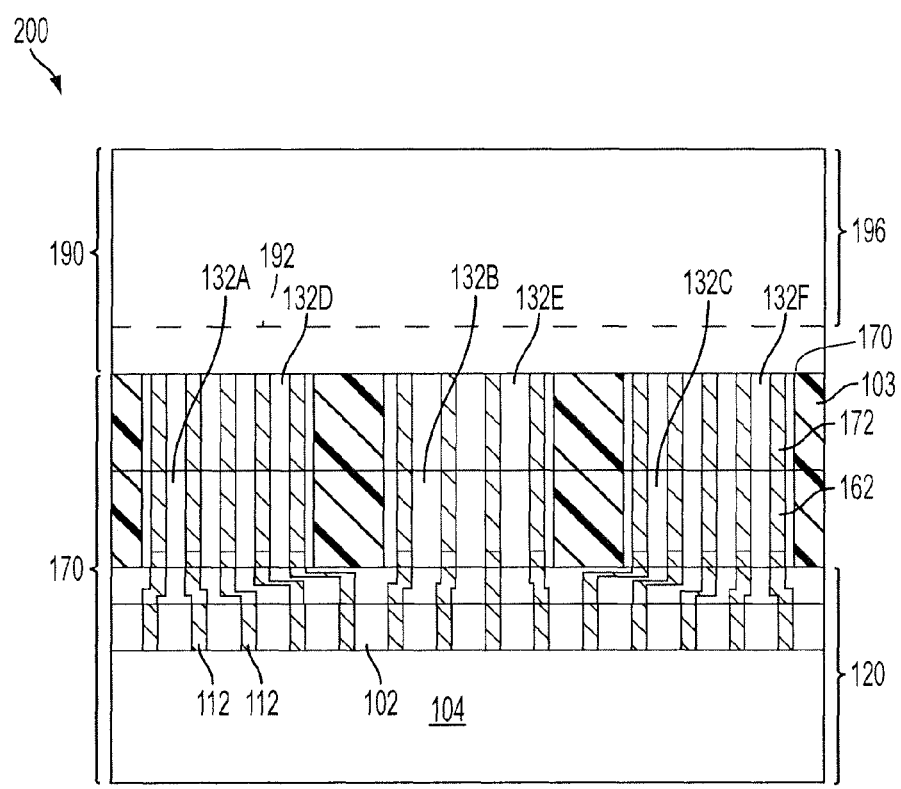
Figure 1K:
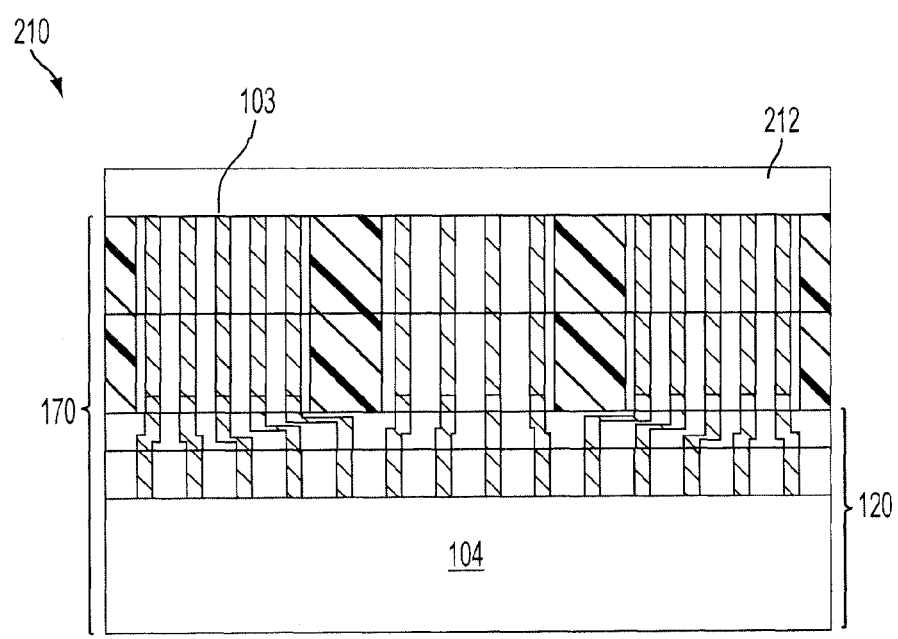

As a non-limiting example, the transferred layer of material 212 may be provided over the processed semiconductor structures 132A-132F to form the bonded semiconductor structure 210 of FIG. 1K using what is referred to in the art as a SMARTCUT® process. Such processes are described in detail in, for example, U.S. Patent No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Referring to FIG. 1I, in a SMARTCUT® process, a plurality of ions (e.g., one or more of hydrogen, helium, or inert gas ions) may be implanted into an additional substrate structure 190 along an ion implant plane 192. In some embodiments, the plurality of ions may be implanted into the additional substrate structure 190 prior to bonding the additional substrate structure 190 over the processed semiconductor structures 132A-132F, as described below with reference to FIG. 1J.

The additional substrate structure 190 may comprise a semiconductor material such as, for example, silicon or germanium. Such a semiconductor material may be polycrystalline or at least substantially comprised of single crystal material, and may be doped or undoped. In additional embodiments, the additional substrate structure 190 may comprise a ceramic material, such as an oxide (e.g., silicon oxide ($SiO_2$), aluminum oxide ($Al_2O_3$), etc.), a nitride (e.g., silicon nitride ($Si_3N_4$), boron nitride (BN), etc.), or an oxynitride (e.g., silicon oxynitride (SiON)). In some embodiments, the additional substrate structure 190 may comprise a wafer-scale substrate.

Ions may be implanted along a direction substantially perpendicular to the major surfaces of the generally planar additional substrate structure 190. As known in the art, the depth at which the ions are implanted into the additional substrate structure 190 is at least partially a function of the energy with which the ions are implanted into the additional substrate structure 190. Generally, ions implanted with less energy will be implanted at relatively shallower depths, while ions implanted with higher energy will be implanted at relatively deeper depths.

Ions may be implanted into the additional substrate structure 190 with a predetermined energy selected to implant the ions at a desired depth within the additional substrate structure 190. The ions may be implanted into the additional substrate structure 190 before or after bonding the additional substrate structure 190 over the processed semiconductor structures 132A-132F, as described below with reference to FIG. 1J. As one particular non-limiting example, the ion implant plane 192 may be disposed within the additional substrate structure 190 at a depth D from a major surface 194 of the additional substrate structure 190 of from about one hundred nanometers (100 nm) to about one thousand nanometers (1,000 nm). As known in the art, inevitably at least some ions may be implanted at depths other than the desired implantation depth D, and a graph of the concentration of the ions as a function of depth into the additional substrate structure 190 from the major surface 194 of the additional substrate structure 190 (e.g., prior to bonding) may exhibit a generally bell-shaped (symmetric or asymmetric) curve having a maximum at the desired implantation depth.

After implanting ions into the additional substrate structure 190, the ions may define an ion implant plane 192 (illustrated as a dashed line in FIG. 1I) within the additional substrate structure 190. The ion implant plane 192 may comprise a layer or region within the additional substrate structure 190, which is aligned with (e.g., centered about) the plane of maximum ion concentration within the additional substrate structure 190. The ion implant plane 192 may define a zone of weakness within the additional substrate structure 190 along which the additional substrate structure 190 may be cleaved or fractured in a subsequent process.

Referring to FIG. 1J, the additional substrate structure 190 may be bonded to the semiconductor structure 170 of FIG. 1H over the processed semiconductor structures 132A-132F on a side thereof opposite the first substrate structure 120 to form the bonded semiconductor structure 200 shown in FIG. 1J. In some embodiments, a direct bonding process may be used to bond the additional substrate structure 190 to the bonded semiconductor structure 170. Optionally, a bonding material (not shown) may be used to bond the additional substrate structure 190 to the bonded semiconductor structure 170. Such a bonding material may comprise one or more of, for example, silicon oxide, silicon nitride, and mixtures thereof. Such a bonding material may be formed or otherwise provided over one or both of the abutting surfaces of the additional substrate structure 190 to the bonded semiconductor structure 170 to improve the bond therebetween.

In some embodiments, the additional substrate structure 190 may be bonded to the bonded semiconductor structure 170 at a temperature of about 400° C. or less, or even at about 350° C. or less. In other embodiments, however, the bonding process may be carried out at higher temperatures.

After bonding the relatively thick additional substrate structure 190 to the bonded semiconductor structure 170, the additional substrate structure 190 may be thinned to form the transferred layer of material 212 and the bonded semiconductor structure 210 shown in FIG. 1K. A portion 196 (FIG. 1J) of the additional substrate structure 190 may be removed from the additional substrate structure 190, leaving the relatively thin transferred layer of material 212 behind on the surface 103 of the bonded semiconductor structure 170.

For example, the additional substrate structure 190 may be heated to cause the additional substrate structure 190 to cleave or fracture along the ion implant plane 192. In some embodiments, during this cleaving process, the temperature of the additional substrate structure 190 may be maintained at about 400° C. or less, or even at about 350° C. or less. In other embodiments, however, the cleaving process may be performed at higher temperatures. Optionally, mechanical forces may be applied to the additional substrate structure 190 to cause or assist in the cleaving of the additional substrate structure 190 along the ion implant plane 192.

In additional embodiments, the relatively thin transferred layer of material 212 may be provided over the bonded semiconductor structure 170 by bonding the additional substrate structure 190 (e.g., a layer having an average thickness of greater than about 100 microns) to the bonded semiconductor structure 170, and subsequently thinning the additional substrate structure 190 from the side thereof opposite the bonded semiconductor structure 170. For example, the additional substrate structure 190 may be thinned by removing material from an exposed major surface of the additional substrate structure 190. For example, material may be removed from the exposed major surface of the additional substrate structure 190 using a chemical process (e.g., a wet or dry chemical etching process), a mechanical process (e.g., a grinding or lapping process), or by a chemical-mechanical polishing (CMP) process. By using such bonding and thinning processes, the thickness of the relatively thin layer of material 102 may be more than twenty microns (20 μm) in some embodiments. In additional embodiments, the thickness of the relatively thin layer of material 102 may be less than twenty microns (20 μm). In some embodiments, such processes may be carried out at a temperature or temperatures of about 400° C. or less, or even about 350° C. or less. In other embodiments, however, such processes may be carried out at higher temperatures.

In yet further embodiments, the relatively thin transferred layer of material 212 may be formed in situ over (e.g., on) the exposed major surface of the bonded semiconductor structure 170. For example, the bonded semiconductor structure 210 of FIG. 1K may be formed by depositing semiconductor material, such as silicon, polysilicon, or amorphous silicon, on an exposed major surface of the bonded semiconductor structure 170 to a desirable thickness. In some embodiments, the deposition process may be performed at a temperature or temperatures of about 400° C. or less, or even about 350° C. or less. For example, a low temperature deposition process for forming the relatively thin transferred layer of material 212 may be performed using a plasma enhanced chemical vapor deposition process, as known in the art. In other embodiments, however, the deposition process may be carried out at higher temperatures.

The bonded semiconductor structure 210 of FIG. 1K is an intermediate structure that may be further processed to form an operable finished semiconductor device. For example, after forming the bonded semiconductor structure 210 of FIG. 1K, at least one of an electrical interconnect, an optical interconnect, and a fluidic interconnect may be formed in the transferred layer of material 212, and one or more additional processed semiconductor structures may be provided over the transferred layer of material 212 in further three-dimensional integration processes.

For example, examples of embodiments of methods that may be used to form one or more electrical interconnects in the transferred layer of material 212 of the bonded semiconductor structure 210 of FIG. 1K are described below with reference to FIGS. 2A through 2E.

Figure 2A:
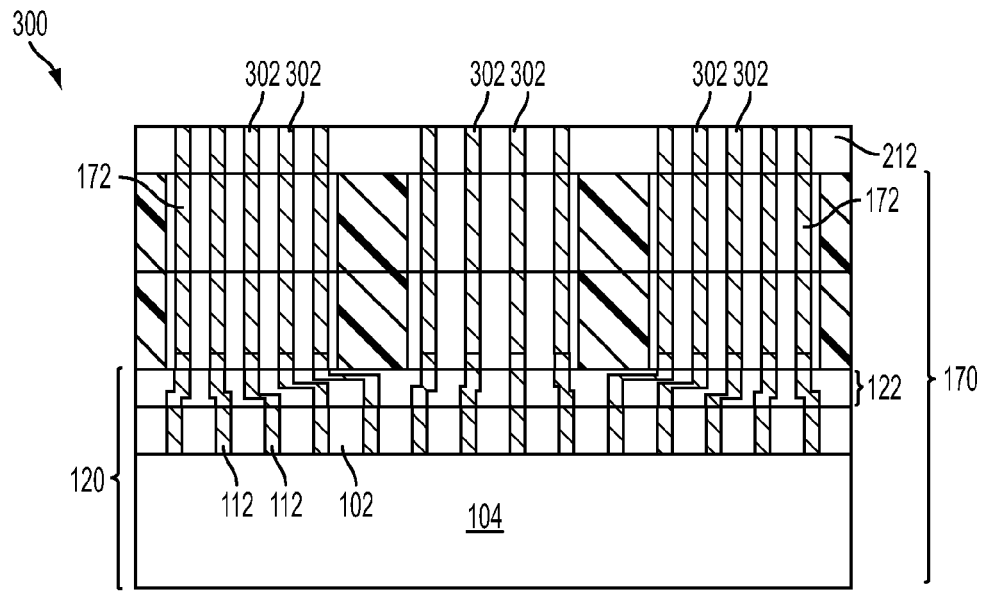
FIGS. 2A through 2E are simplified cross-sectional views of semiconductor structures and depict the formation of a bonded semiconductor structure from an intermediate structure shown in FIG. 1K in accordance with example embodiments of the invention, wherein electrical interconnects are formed in a transferred semiconductor layer on the intermediate structure.

Referring to FIG. 2A, a plurality of electrical interconnects 302 may be formed in the transferred layer of material 212 to form the bonded semiconductor structure 300 of FIG. 2A. In some embodiments, the electrical interconnects 302 may comprise through wafer interconnects, and each electrical interconnect 302 may extend through the transferred layer of material 212 to one of the through wafer interconnects 172, such that each electrical interconnect 302 is structurally and electrically coupled with one of the through wafer interconnects 172. The electrical interconnects 302 may comprise a conductive material, such as a metal or metal alloy (e.g., copper or a copper alloy). The electrical interconnects 302 may be formed using methods as previously described in relation to the through wafer interconnects 112 with reference to FIG. 1B.

Figure 2B:
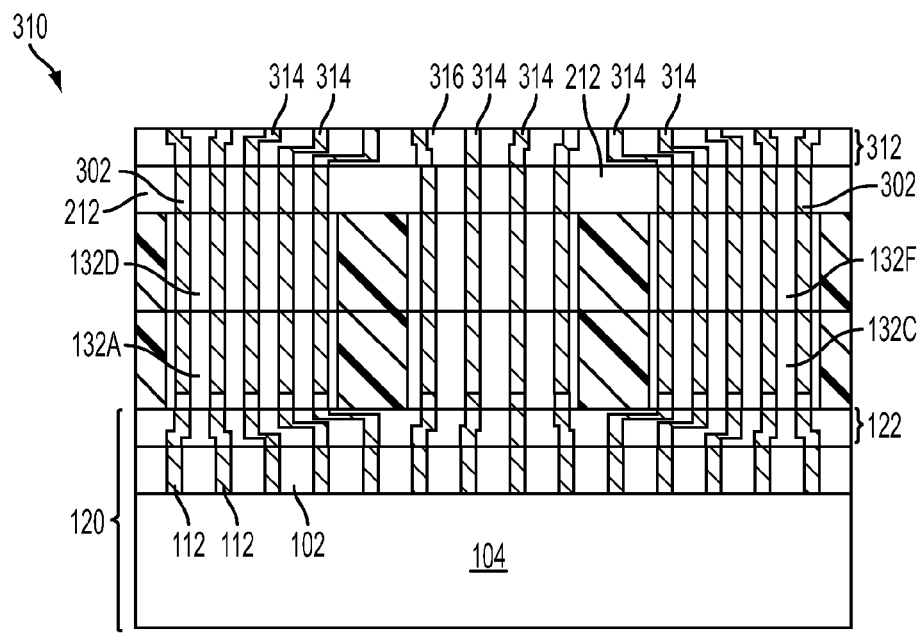

After forming the plurality of electrical interconnects 302 in the transferred layer of material 212, one or more redistribution layers (RDLs) 312 optionally may be formed over the transferred layer of material 212 on a side thereof opposite the processed semiconductor structures 132A-132F to form the bonded semiconductor structure 310 shown in FIG. 2B. The redistribution layer 312 may comprise a plurality of conductive features 314, which are disposed within and surrounded by a dielectric material 316, and may be formed as previously described in relation to the redistribution layer 122 with reference to FIG. 1C. The conductive features 314 may include one or more of conductive pads, laterally extending conductive lines or traces, and vertically extending conductive vias. Furthermore, the redistribution layer 312 may comprise a plurality of layers formed sequentially one over another, each layer comprising conductive features 314 and dielectric material 316.

Figure 2C:
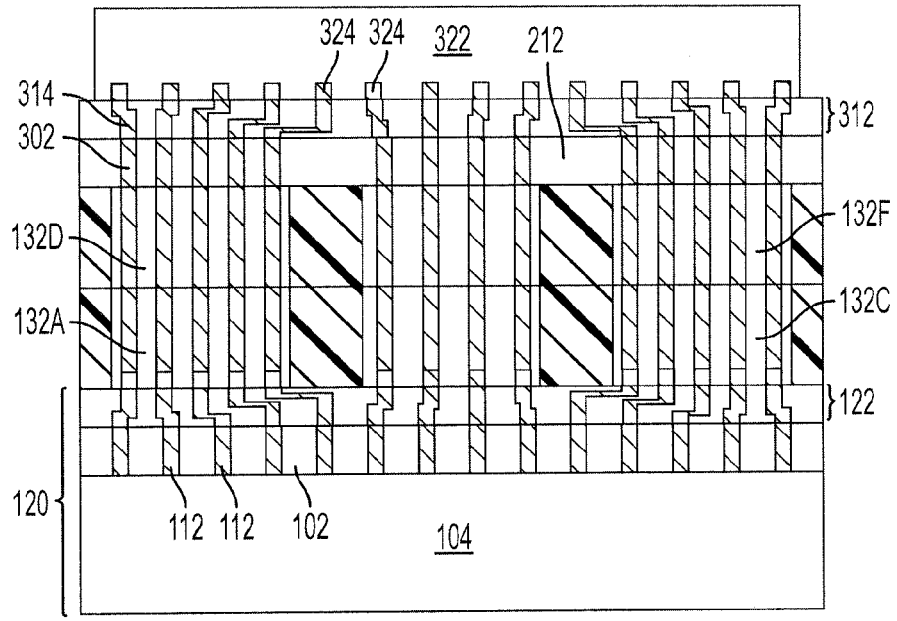

Referring to FIG. 2C, after forming the redistribution layer 312, at least one processed semiconductor structure 322 may be bonded over the transferred layer of material 212 on a side thereof opposite the processed semiconductor structures 132A-132F to form the bonded semiconductor structure 320 of FIG. 2C. For example, the at least one processed semiconductor structure 322 may be bonded directly to the redistribution layer 312, as shown in FIG. 2C. One or more conductive features 324 of the processed semiconductor structure 322, such as bond pads, may be electrically and structurally coupled with the conductive features 314 of the redistribution layer 312, and the electrical interconnects 302 in the transferred layer of material 212.

By way of example and not limitation, the additional processed semiconductor device 322 may comprise a semiconductor die, and may include one or more of an electronic signal processor, a memory device, and an optoelectronic device (e.g., a light-emitting diode, a laser, a photodiode, a solar cell, etc.).

The additional processed semiconductor structure 322 may be directly bonded to the dielectric material 316, the electrical interconnects 314, or to both the dielectric material 316 and the electrical interconnects 314 of the redistribution layer 312. The direct bonding process used to bond the additional processed semiconductor device 322 to the dielectric material 316 and/or the electrical interconnects 314 may be performed at a temperature or temperatures of about 400° C. or less. In some embodiments, the bonding process may comprise a thermocompression, or a non-thermocompression direct bonding process, performed at a temperature or temperatures of about 400° C. or less. In additional embodiments, the bonding process may comprise an ultra-low temperature direct bonding process performed at a temperature or temperatures of about 200° C. or less. In some instances, the bonding process may be performed at about room temperature. Additionally, the bonding process may comprise a surface-assisted bonding process in some embodiments. The direct bonding process may comprise an oxide-to-oxide (e.g., silicon dioxide-to-silicon dioxide) direct bonding process, and/or a metal-to-metal (e.g., copper-to-copper) direct bonding process.

Figure 2D:
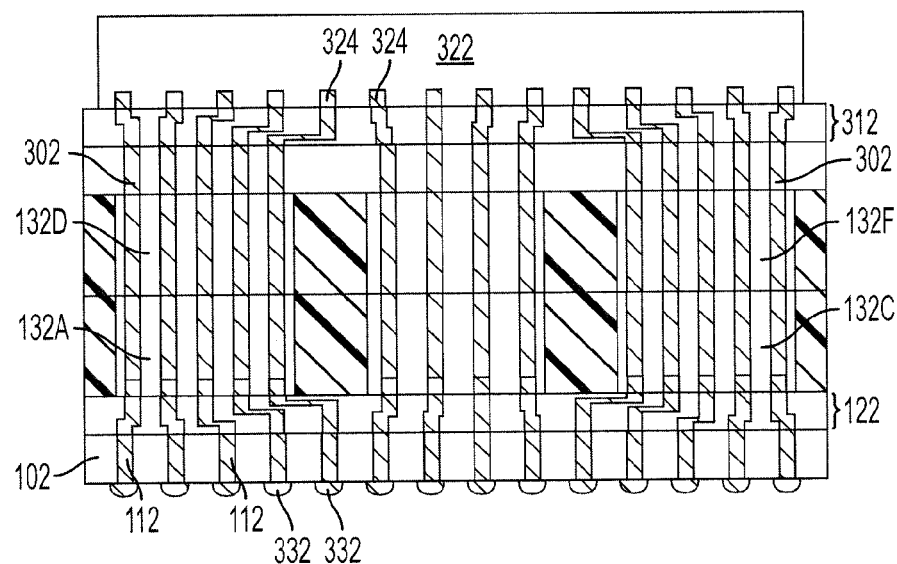

Referring to FIG. 2D, after bonding the additional processed semiconductor structure 322 to the bonded semiconductor structure 310 of FIG. 2B, the relatively thick substrate body 104 of the first substrate structure 120 may be removed, leaving the relatively thin layer of material 102 and the through wafer interconnects 112 extending therethrough bonded to the redistribution layer 122 and the processed semiconductor structures 132A-132F. For example, the relatively thick substrate body 104 may be separated and recovered from the relatively thin layer of material 102 in a manner that does not cause any significant or irreparable damage to the relatively thick substrate body 104.

After removing the relatively thick substrate body 104 of the substrate structure 120 from the bonded semiconductor structure 320 (FIG. 2C), the relatively thick substrate body 104 may be recovered and reused. For example, the relatively thick substrate body 104 may be reused one or more times in methods of forming bonded semiconductor structures, such as those described herein.

Optionally, a conductive bump 332 may be provided on the exposed end of each of the through wafer interconnects 112 to form the bonded semiconductor structure 330 of FIG. 2D. The conductive bumps 332 may comprise a conductive metal or metal alloy, such as a reflowable solder alloy, and may be used to facilitate structurally and electrically coupling the through wafer interconnects 112 of the bonded semiconductor structure 330 to conductive features of another structure, which may be or include a higher level substrate or device.

Figure 2E:
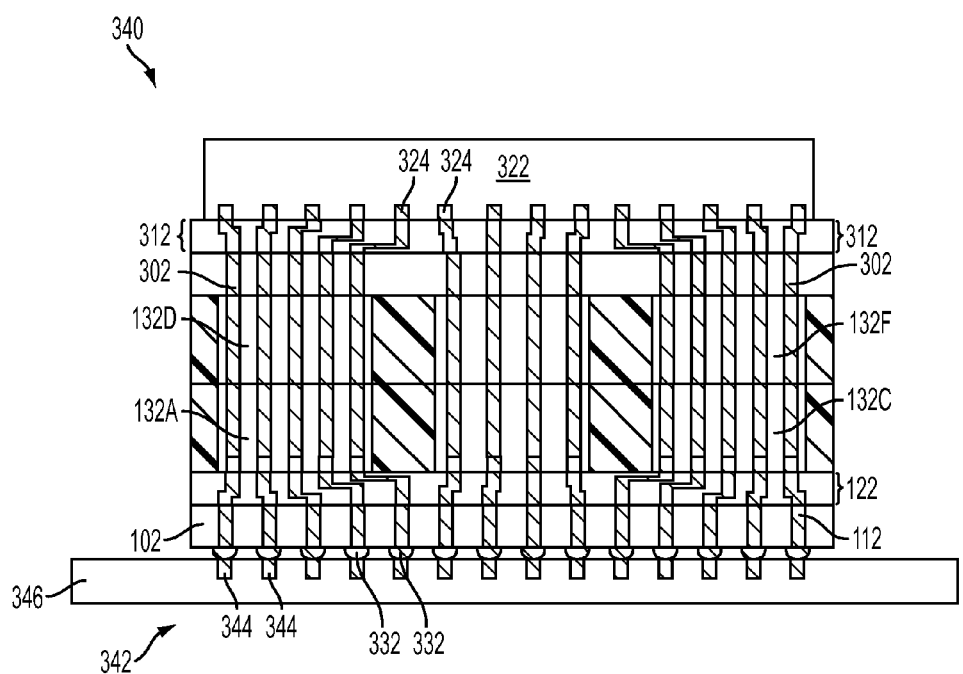

For example, as shown in FIG. 2E, the bonded semiconductor structure 330 of FIG. 2D may be structurally and electrically coupled to a structure 342 to form the bonded semiconductor structure 340 shown in FIG. 2E. For example, the structure 342 may comprise another processed semiconductor structure or a printed circuit board. As shown in FIG. 2E, the structure 342 may comprise a plurality of conductive features 344 and a surrounding dielectric material 346. The conductive features 344 may comprise bond pads, for example. The conductive bumps 332 may be aligned with and abutted against the conductive features 344. The conductive bumps 332 may be heated to cause the material of the conductive bumps 332 to reflow, after which the material may be cooled and solidified, thereby forming a structural and electrical bond between the through wafer interconnects 112 and the conductive features 344 of the structure 342.

The bonded semiconductor structure 340 of FIG. 2E may be further processed as needed or desirable in order to render the bonded semiconductor structure 340 suitable for its intended use. As a non-limiting example, a protective coating or encapsulating material may be provided over at least a portion of the bonded semiconductor structure 340, and/or a protective bonding material may be provided between the structure 342 and the layer of material 102 between and around the conductive bumps 332.

As previously mentioned, not only can electrical interconnects be formed in the transferred layer of material 212 of the bonded semiconductor structure 210 of FIG. 1K, but optical interconnects and fluidic interconnects may be formed therein as well. Examples of embodiments of methods that may be used to form one or more optical interconnects in the transferred layer of material 212 of the bonded semiconductor structure 210 of FIG. 1K are described below with reference to FIGS. 3A through 3C and 4A through 4D.

Figure 3A:
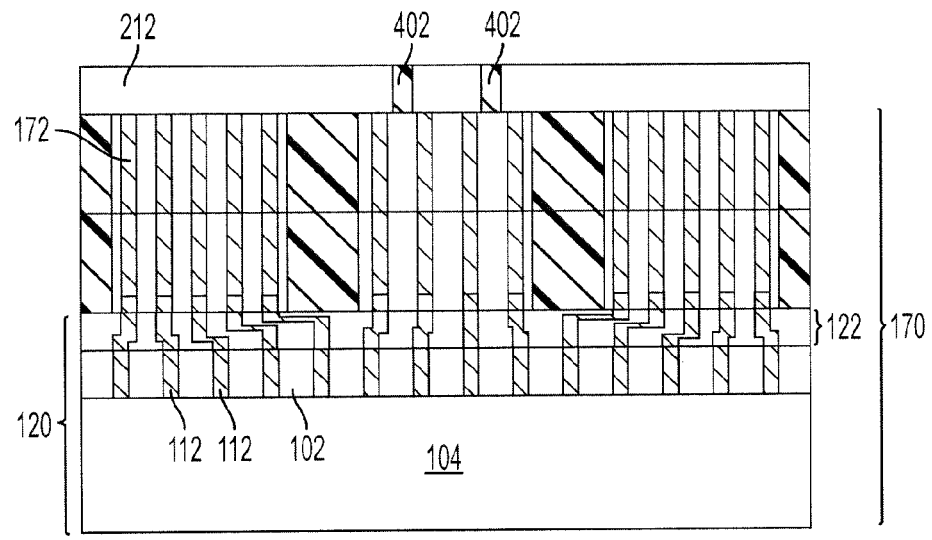
FIGS. 3A through 3C are simplified cross-sectional views of semiconductor structures and depict the formation of another bonded semiconductor structure from the intermediate structure shown in FIG. 1K in accordance with additional example embodiments of the invention, wherein optical interconnects are formed in a transferred semiconductor layer on the intermediate structure.

As shown in FIG. 3A, one or more optical interconnects 402 may be formed in the transferred layer of material 212. In some embodiments, the optical interconnects 402 may comprise generally straight vertically oriented (i.e., vertical from the perspective of FIG. 3A) columns (e.g., cylinders) that have a composition, a size, and a shape that cause them to be configured to behave as waveguides for one or more wavelengths of electromagnetic radiation. The optical interconnects 402 may comprise what are referred to in the art as "optical vias" (OVs) or "through silicon optical vias" (TSOVs).

The composition of the optical interconnects 402 may differ from the composition of the transferred layer of material 212, such that there is a change in the index of refraction across the boundary between the optical interconnects 402 and the transferred layer of material 212. In other words, the transferred layer of material 212 may comprise a material that exhibits a first index of refraction, and the optical interconnects 402 may comprise a material that exhibits a second, different index of refraction. By way of example and not limitation, in some embodiments, the transferred layer of material 212 may comprise silicon, and the optical interconnects 402 may comprise a polymer material (e.g., a polynorbornene polymer material).

Figure 4A:
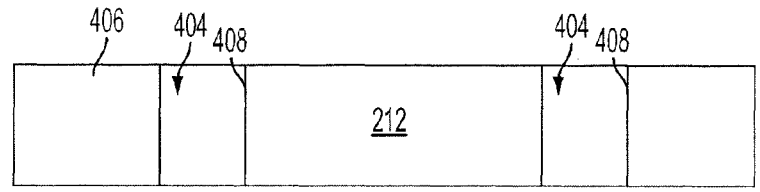
FIGS. 4A through 4D are simplified cross-sectional views of semiconductor structures and depict the formation of optical interconnects in accordance with examples of techniques that may be employed in the methods described with reference to FIGS. 3A through 3C.

Various processes for forming optical interconnects, like the optical interconnects 402, are known in the art and may be employed in embodiments of the invention. An example of a method that may be used to fabricate such optical interconnects 402 in the transferred layer of material 212 is described below with reference to FIGS. 4A through 4D. FIG. 4A is an enlarged simplified view of the transferred layer of material 212. As shown therein, a plurality of apertures 404 may be formed through the transferred layer of material 212. To form the apertures 404, a patterned mask layer may be provided over the exposed major surface 406 of the transferred layer of material 212. The patterned mask layer may include apertures extending therethrough at the locations at which it is desired to form the apertures 404 (and the optical interconnects 402) through the transferred layer of material 212. An etching process (e.g., an anisotropic wet chemical etching process or an anisotropic dry reactive ion etching process) then may be used to etch the apertures 404 through the transferred layer of material 212.

If the transferred layer of material 212 comprises silicon, the exposed surfaces 408 of the transferred layer of material 212 within the apertures 404 optionally may be oxidized to form a layer of silicon dioxide at the exposed surfaces 408. In this configuration, the layer of oxide material may serve as an optical cladding material surrounding the optical interconnects 402.

Figure 4B:
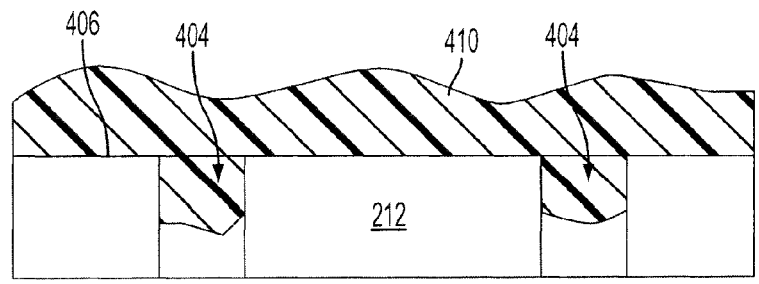

Referring to FIG. 4B, after forming the apertures 404, the patterned mask layer may be removed, and a polymer precursor material 410 may be applied over the exposed major surface 406 of the transferred layer of material 212 and at least partially within the apertures 404. For example, a spin-on process may be used to apply a liquid polymer precursor material 410 over the exposed major surface 406 of the transferred layer of material 212 and at least partially within the apertures 404. Optionally, surfaces within the apertures 404 may be at least partially covered with a dielectric material, such as silicon dioxide, another oxide material, or a nitride material. As shown in FIG. 4B, in some embodiments, the apertures 404 may only be partially filled with the polymer precursor material 410 after the initial deposition process.

Figure 4C:
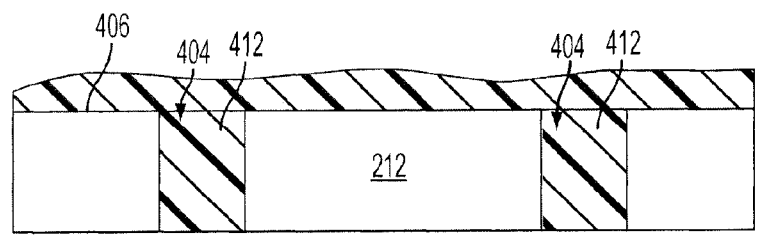

Referring to FIG. 4C, a pressure may be applied over the deposited liquid polymer precursor material 410 using, for example, a pressurized gas, to cause the polymer precursor material 410 to at least substantially fill the apertures 404, after which the polymer precursor material 410 may be polymerized to form a solid polymer material 412, which is disposed within the apertures 404. In some methods, the material 410 may enter and fill the apertures 404 without the need for any assistance of applied pressure.

Figure 4D:
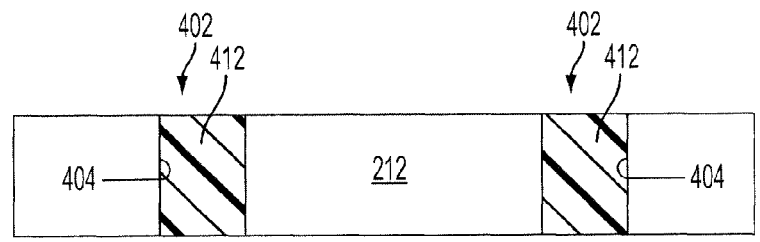

After providing the solid polymer material 412 within the apertures 404, excess solid polymer material 412 may be disposed over the major surface 406 of the transferred layer of material 212 as shown in FIG. 4C. As shown in FIG. 4D, the excess solid polymer material 412 over the major surface 406 may be removed using, for example, a chemical etching process, a mechanical polishing process, and/or a chemical-mechanical polishing (CMP) process. Removing the excess polymer material 412 defines and forms the optical interconnects 402, which comprise the remaining portions of the polymer material 412 within the apertures 404.

Referring again to FIG. 3A, each of the optical interconnects 402 may be aligned and optically coupled with a respective waveguide or other optical device or structure (e.g., a laser, a light-emitting diode, a photodiode, etc.) within the underlying processed semiconductor structures 132A-132F.

Figure 3B:
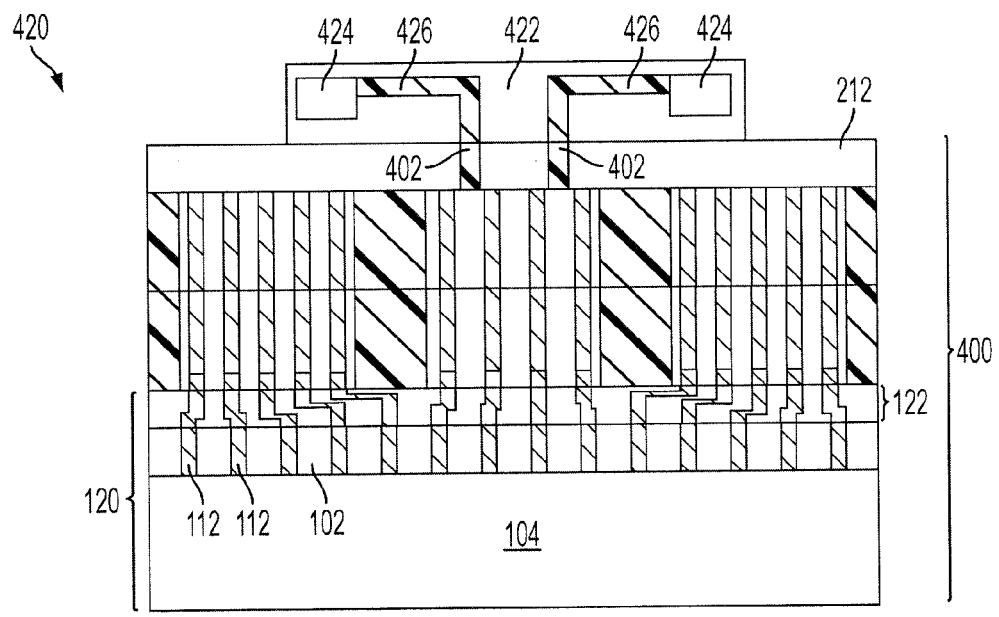

Referring to FIG. 3B, after forming the optical interconnects 402 in the transferred layer of material 212, at least one processed semiconductor structure 422 may be bonded over the transferred layer of material 212 on a side thereof opposite the processed semiconductor structures 132A-132F to form the bonded semiconductor structure 420 of FIG. 3B. By way of example and not limitation, the additional processed semiconductor device 422 may comprise a semiconductor die, and may include one or more optoelectronic devices 424, which are configured to receive and/or emit electromagnetic radiation (e.g., a light-emitting diode, a laser, a photodiode, a solar cell, etc.). As shown in FIG. 3B, the processed semiconductor device 422 also may include one or more waveguides 426, which may comprise laterally extending sections and/or vertically extending sections (from the perspective of FIG. 3B). The waveguides 426 may be operatively (i.e., optically) coupled with the optoelectronic devices 424, such that electromagnetic radiation may be carried to and/or from the optoelectronic devices 424 through the waveguides 426. The waveguides 426 also may be operatively coupled with the optical interconnects 402 in the transferred layer of material 212, and to other active device structures within the bonded semiconductor structure 420 (or to an optical output, for coupling to another optically active device outside the bonded semiconductor structure 420).

The additional processed semiconductor structure 422 may be directly bonded to the transferred layer of material 212. The direct bonding process used to bond the additional processed semiconductor device 422 to the transferred layer of material 212 may be performed at a temperature or temperatures of about 400° C. or less. In some embodiments, the bonding process may comprise a thermocompression direct bonding process, or a non-thermocompression direct bonding process, performed at a temperature or temperatures of about 400° C. or less. In additional embodiments, the bonding process may comprise an ultra-low temperature direct bonding process performed at a temperature or temperatures of about 200° C. or less. In some instances, the bonding process may be performed at about room temperature. Additionally, the bonding process may comprise a surface-assisted bonding process in some embodiments. The direct bonding process may comprise an oxide-to-oxide (e.g., silicon dioxide-to-silicon dioxide) direct bonding process, and/or a metal-to-metal (e.g., copper-to-copper) direct bonding process.

Figure 3C:
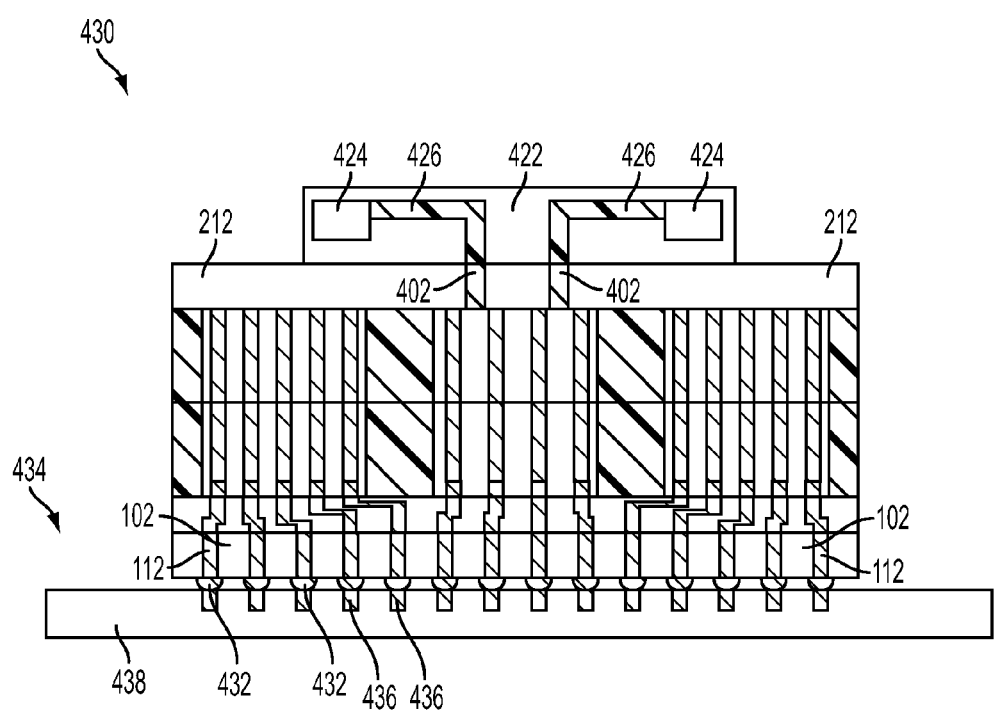

Referring to FIG. 3C, after bonding the additional processed semiconductor structure 422 to the bonded semiconductor structure 420 of FIG. 3B to form the bonded semiconductor structure 420, the bonded semiconductor structure 420 may be further processed as previously described with reference to FIGS. 2D and 2E to form the bonded semiconductor structure 430 shown in FIG. 3C. For example, the relatively thick substrate body 104 of the first substrate structure 120 may be removed (and optionally recovered and reused), a conductive bump 432 may be provided on the exposed end of each of the through wafer interconnects 112, and the resulting structure may be structurally and electrically coupled to another structure 434 to form the bonded semiconductor structure 430 shown in FIG. 3C. For example, the structure 434 may comprise another processed semiconductor structure or a printed circuit board. As shown in FIG. 3C, the structure 434 may comprise a plurality of conductive features 436 (e.g., bond pads) and a surrounding dielectric material 438. The conductive bumps 432 may be aligned, abutted against, and bonded to the conductive features 436, thereby forming a structural and electrical bond between the through wafer interconnects 112 and the conductive features 436 of the structure 434.

The bonded semiconductor structure 430 of FIG. 3C may be further processed as needed or desirable in order to render the bonded semiconductor structure 430 suitable for its intended use. As a non-limiting example, a protective coating or encapsulating material may be provided over at least a portion of the bonded semiconductor structure 430, and/or a protective bonding material may be provided between the structure 434 and the layer of material 102 between and around the conductive bumps 432.

Examples of embodiments of methods that may be used to form one or more fluidic interconnects in the transferred layer of material 212 of the bonded semiconductor structure 210 of FIG. 1K are described below with reference to FIGS. 5A through 5E.

The fluid interconnects to be formed may be part of a fluid circuit through which a fluid may be caused to flow for purposes of cooling the processed semiconductor devices within the bonded semiconductor structure during operation.

Figure 5A:
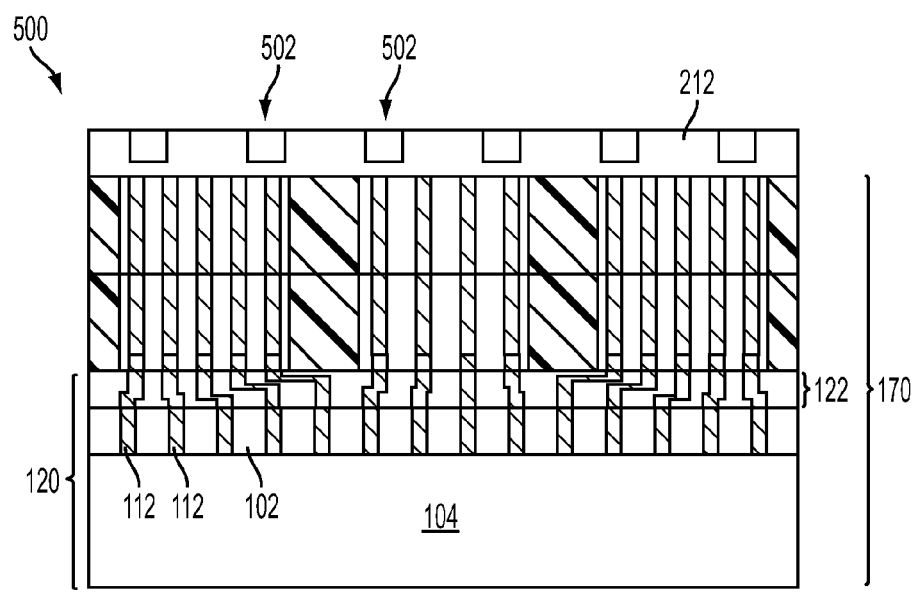
FIGS. 5A through 5E are simplified cross-sectional views of semiconductor structures and depict the formation of another bonded semiconductor structure from the intermediate structure shown in FIG. 1K in accordance with additional example embodiments of the invention, wherein fluidic interconnects are formed in a transferred semiconductor layer on the intermediate structure.
Figure 5B:
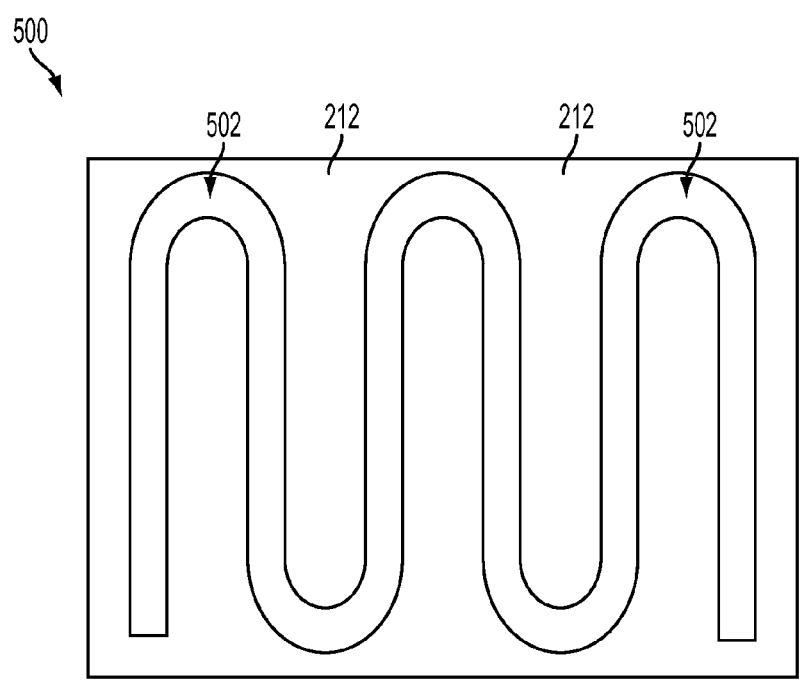

As shown in FIG. 5A, one or more recesses 502 (e.g., channels) may be formed in (e.g., at least partially through) the transferred layer of material 212 to form the bonded semiconductor structure 500 shown in FIG. 5A. For example, as shown in FIGS. 5A and 5B, a single recess 502 may be formed in, and partially through, the transferred layer of material 212, which recess 502 has a serpentine shape that curves back and forth across the transferred layer of material 212. The one or more recesses 502, however, may have any other shape in additional embodiments of the invention.

Various processes that may be used to form such a recess 502 are known in the art and may be employed in embodiments of the invention. As a non-limiting example, a patterned mask layer may be provided over the exposed major surface of the transferred layer of material 212. The patterned mask layer may include one or more apertures extending therethrough at the location or locations at which it is desired to form the one or more recesses 502 in the transferred layer of material 212. An etching process (e.g., an anisotropic wet chemical etching process or an anisotropic dry reactive ion etching process) then may be used to etch the recess or recesses 502 in the transferred layer of material 212. After forming the recess or recesses 502, the patterned mask layer may be removed.

Figure 5C:
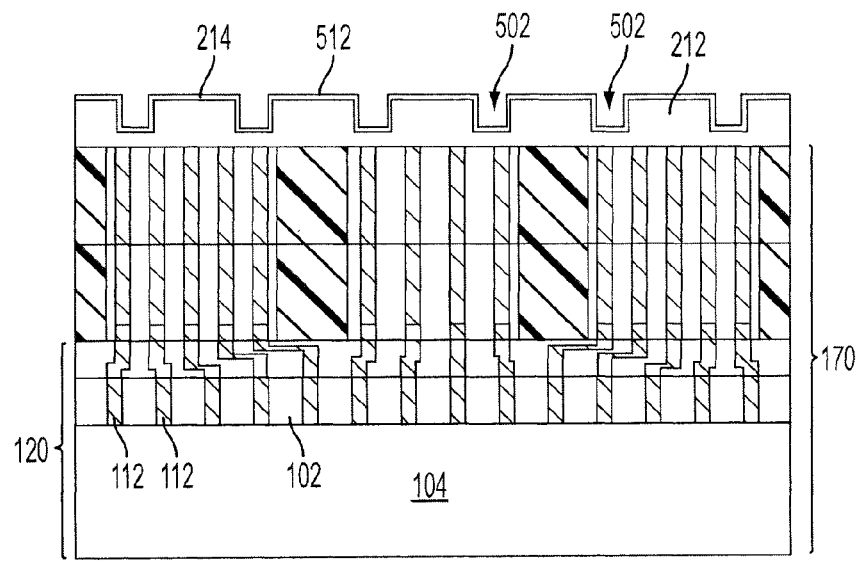

Referring to FIG. 5C, in some embodiments, a layer of protective material 512 may be provided at least over the exposed surfaces of the transferred layer of material 212 within the recesses 502. In some embodiments, the layer of protective material 512 may also be provided over the major surface 214 of the transferred layer of material 212 outside the recesses 502, as shown in FIG. 5C.

The layer of protective material 512 may be used to protect the exposed surfaces of the transferred layer of material 212 within the recesses 502 from damage that might otherwise be caused from a fluid to be flown through the fluidic interconnects to be formed from the recesses 502. For example, in embodiments in which the transferred layer of material 212 comprises silicon or germanium, the layer of protective material 512 may comprise silicon oxide or germanium oxide, respectively. Such an oxide material may be formed by oxidizing the surface of the transferred layer of material 212 (e.g., using a low temperature oxidation process), or by depositing an oxide material using, for example, a low temperature chemical vapor deposition process (CVD).

Figure 5D:
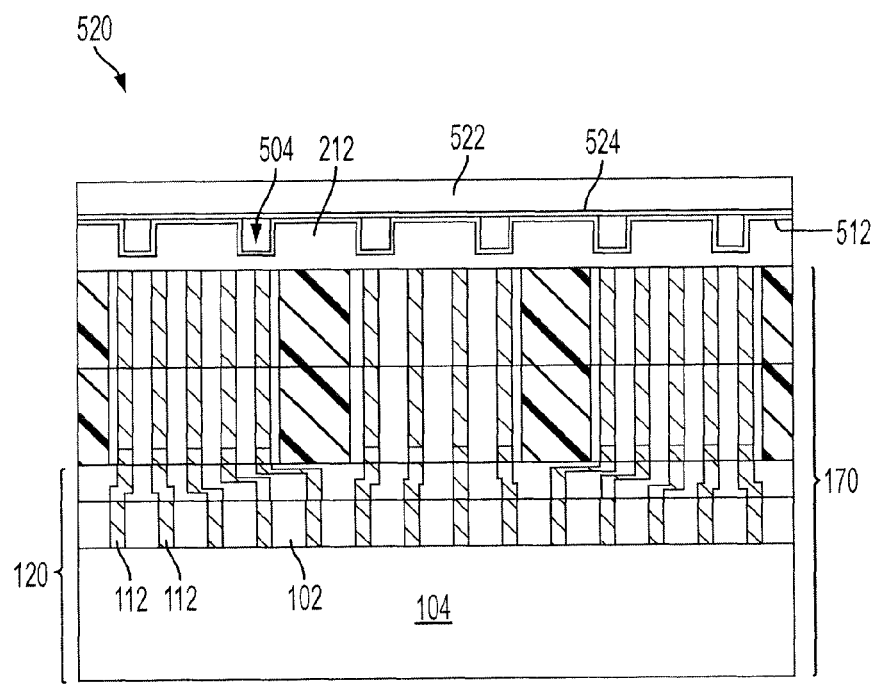

Referring to FIG. 5D, after forming the recesses 502 in the transferred layer of material 212, another layer of material 522 may be provided over the transferred layer of material 212 to cover and enclose the recesses 502 and form the bonded semiconductor structure 520 shown in FIG. 5D. By covering and enclosing the recesses 502, one or more fluid interconnects 504 (i.e., fluid passageways) are defined, which extend through the bonded semiconductor structure 520 at the interface between the transferred layer of material 212 and the layer of material 522.

The layer of material 522 may comprise at least a portion of a substrate structure, and may comprise at least a portion of a wafer-scale substrate structure in some embodiments. The layer of material 522 may comprise, for example, any of the materials previously mentioned in relation to the additional substrate structure 190 of FIG. 1I. In some embodiments, the layer of material 522 may have the same composition as that of the transferred layer of material 212.

As a non-limiting example, the layer of material 522 may be provided over the transferred layer of material 212 using a SMARTCUT® process, as previously described with reference to FIGS. 1I and 1J. For example, a plurality of ions (e.g., one or more of hydrogen, helium, or inert gas ions) may be implanted into an additional substrate structure (not shown) along an ion implant plane, the additional substrate structure then may be bonded to the transferred layer of material 212, after which the additional substrate structure may be fractured along the ion implant plane so as to remove a portion of the substrate structure leaving the layer of material 522 bonded to the transferred layer of material 212.

The layer of material 522 may be directly bonded to the transferred layer of material 212. The direct bonding process used to bond the layer of material 522 to the transferred layer of material 212 may be performed at a temperature or temperatures of about 400° C. or less. In some embodiments, the bonding process may comprise a thermocompression direct bonding process performed at a temperature or temperatures of about 400° C. or less. In additional embodiments, the bonding process may comprise an ultra-low temperature direct bonding process performed at a temperature or temperatures of about 200° C. or less. In some instances, the bonding process may be performed at about room temperature. Additionally, the bonding process may comprise a surface-assisted bonding process in some embodiments. The direct bonding process may comprise an oxide-to-oxide (e.g., silicon dioxide-to-silicon dioxide) direct bonding process, and/or a metal-to-metal (e.g., copper-to-copper) direct bonding process.

In some embodiments, a bonding layer 524 may be formed or otherwise provided on the surface of the layer of material 522 to be bonded to the transferred dielectric material 212. For example, the bonding layer 524 may comprise an oxide layer (e.g., silicon dioxide) in embodiments in which the layer of protective material 522 also comprises an oxide layer. Machining the compositions of the bonding layer 524 and the layer of protective material 522 also may facilitate bonding of the layer of material 522 to the transferred dielectric material 212 in a direct bonding process (e.g., a direct oxide-to-oxide bonding process).

Figure 5E:
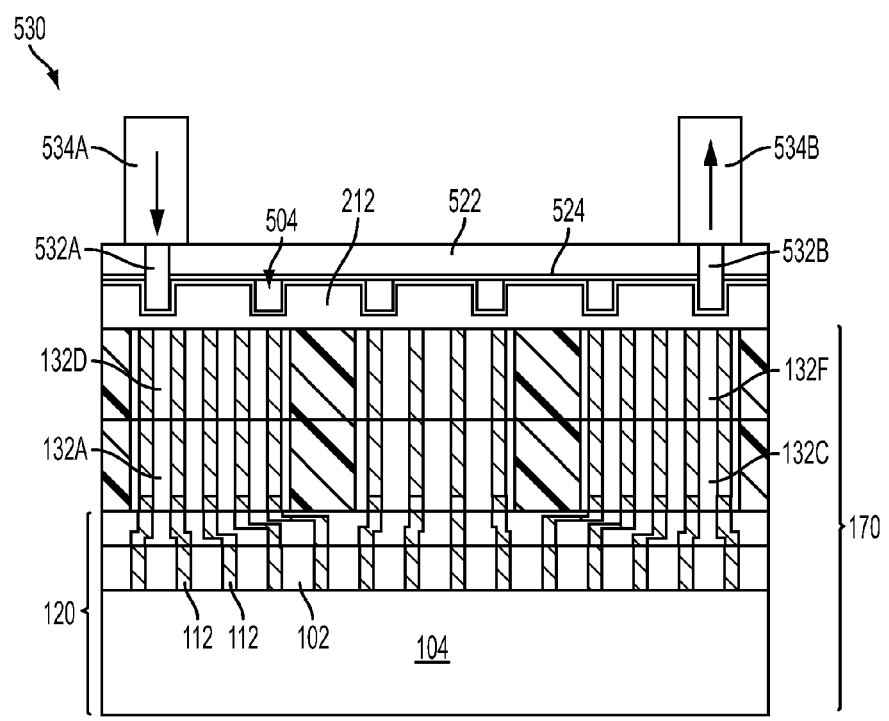

After covering and enclosing the recesses 502 in the transferred layer of material 212 with the layer of material 522 to form the fluidic interconnect 504, one or more access apertures 532A, 532B may be formed through the layer of material 522 that extend to the fluidic interconnect 504 in the transferred layer of material 212, as shown in the bonded semiconductor structure 530 of FIG. 5E. For example, a masking and etching process, such as those previously described herein, may be used to form the access apertures 532A, 532B through the layer of material 522 to the fluidic interconnect 504 within the bonded semiconductor structure 530. For example, a first access aperture 532A may provide access to a first end of a fluidic interconnect 504, and a second access aperture 532B may provide access to an opposite second end of the fluidic interconnect 504. In this configuration, the first access aperture 532A may provide a fluid inlet to the fluidic interconnect 504, and the second access aperture 532B may provide a fluid outlet from the fluidic interconnect 504. A first fluid conduit 534A then may be coupled to the first access aperture 532A, and a second fluid conduit 534B may be coupled to the second access aperture 532B, as shown in FIG. 5E.

In this configuration, during operation and use of the processed semiconductor structures 132A-132F within the bonded semiconductor structure 530, fluid (e.g., a cooling fluid) may be caused to flow through the first fluid conductor 534A and the first access aperture 532A into the fluid interconnect 504, through the fluid interconnect 504, and out from the fluidic interconnect 504 through the second access aperture 532B and the second fluid conduit 534B as represented by the directional arrows within the fluid conduits 534A, 534B. Thus, one or more fluid interconnects 504 may be formed in the transferred layer of material 212.

After forming the bonded semiconductor structure 530 of FIG. 5E, the bonded semiconductor structure 530 may be further processed as previously described in relation to the bonded semiconductor structure 320 with reference to FIGS. 2C through 2E, and in relation to the bonded semiconductor structure 420 with reference to FIGS. 3B and 3C.

As discussed hereinabove, embodiments of the present invention enable the fabrication of inter-strata electrical, optical, and microfluidic interconnects in three-dimensionally integrated bonded semiconductor structures, which include a plurality of strata each comprising one or more processed semiconductor structures. In the embodiments described above, each inter-strata layer of interconnects includes only a single type of interconnect (i.e., one of electrical interconnects, optical interconnects, and fluidic interconnects). In additional embodiments of the invention, one or more of the inter-strata layers of interconnects may comprise two or three different types of interconnects (e.g., electrical and optical interconnects, electrical and fluidic interconnects, optical and fluidic interconnects, or electrical, optical, and fluidic interconnects). Such interconnect layers may be fabricated using the methods described hereinabove, by masking and protecting the transferred layer of material 212 over regions to include one type of interconnect while another type of interconnect is fabricated in a different unmasked region of the transferred layer of material 212. The mask then may be removed, and another mask may be applied over the previously fabricated interconnects while another type of interconnects are fabricated in a different unmasked region of the transferred layer of material 212.

Figure 6:
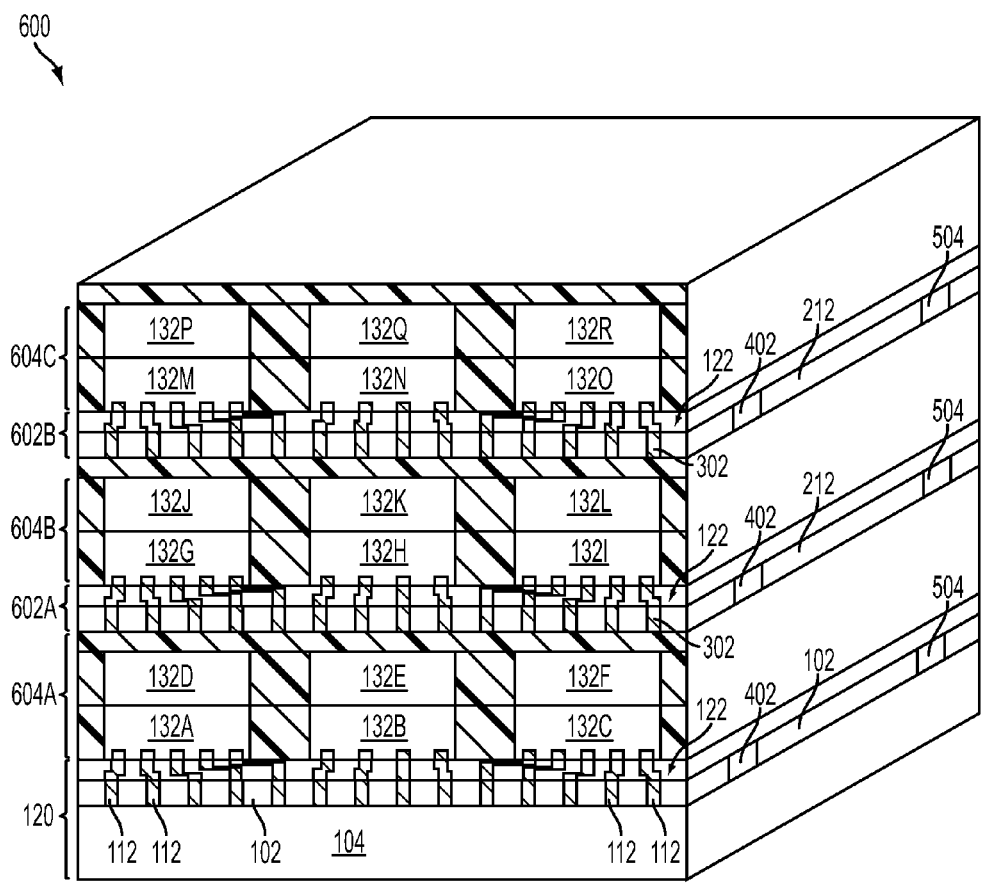
FIG. 6 is a simplified partially cutaway perspective view of a three-dimensionally integrated bonded semiconductor structure that may be formed using embodiments of the methods of the present invention, and that includes multiple layers of processed semiconductor structures with interconnect layers therebetween having three different types of interconnects therein.

FIG. 6 is a simplified partially cutaway perspective view of a bonded semiconductor structure 600 that includes two inter-strata interconnect layers 602A and 602B, which may be fabricated in accordance with embodiments of methods of the invention, as previously described herein.

The bonded semiconductor structure 600 includes a first layer 604A of processed semiconductor structures 132A-132F, a second layer 604B of processed semiconductor structures 132G-132L, and a third layer 604C of processed semiconductor structures 132M-132R. The processed semiconductor structures 132A-132R may comprise, for example, semiconductor dies, and may include one or more of electronic signal processors, memory devices, and optoelectronic devices (e.g., light-emitting diodes, lasers, photodiodes, solar cells, etc.). Some of the processed semiconductor structures 132A-132R in each of the layers 604A-604C may be vertically stacked one over another, and may be operatively coupled with one another.

Each of the interconnect layers 602A and 602B may comprise a transferred layer of material 212 as described hereinabove. As shown in FIG. 6, each of the interconnect layers 602A and 602B includes at least one electrical interconnect 302, at least one optical interconnect 402, and at least one fluidic interconnect 504. In some embodiments, one or more of the electrical interconnects 302, optical interconnects 402, and fluidic interconnects 504 may be operatively coupled with one or more of the processed semiconductor structures 132A-132R.

The bonded semiconductor structure 600 also includes a substrate structure 120 as previously described herein, over which the first layer 604A of processed semiconductor structures 132A-132F are bonded. As previously discussed, the substrate structure 120 may comprise a relatively thin layer of material 102 over a relatively thick substrate body 104, with a plurality of through wafer interconnects 112 formed through the layer of material 102. Also, a redistribution layer 122 may be provided over the layer of material 102, as previously described herein. As shown in FIG. 6, in some embodiments, at least one optical interconnect 302 and/or at least one microfluidic interconnect 504 also may be formed in the relatively thin layer of material 102.

Additionally, as shown in FIG. 6, each of the interconnect layers 602A and 602B also may include a redistribution layer 122, which may be used to redistribute the electrical interconnects 302, optical interconnects 402, and fluidic interconnects 504.

The processes described hereinabove may be repeated any number of times to form any desirable number of layers of processed semiconductor devices with interconnect layers therebetween.

After forming the bonded semiconductor structure 600 shown in FIG. 6, the bonded semiconductor structure 600 may be further processed as previously described in relation to the bonded semiconductor structure 320 with reference to FIGS. 2C through 2E, and in relation to the bonded semiconductor structure 420 with reference to FIGS. 3B and 3C.

In the bonded semiconductor structure 600 of FIG. 6, each interconnect layer includes each of electrical interconnects, optical interconnects, and fluidic interconnects. In additional embodiments, each interconnect layer may comprise only a single type of interconnect, or only two types of interconnects.

Figure 7:
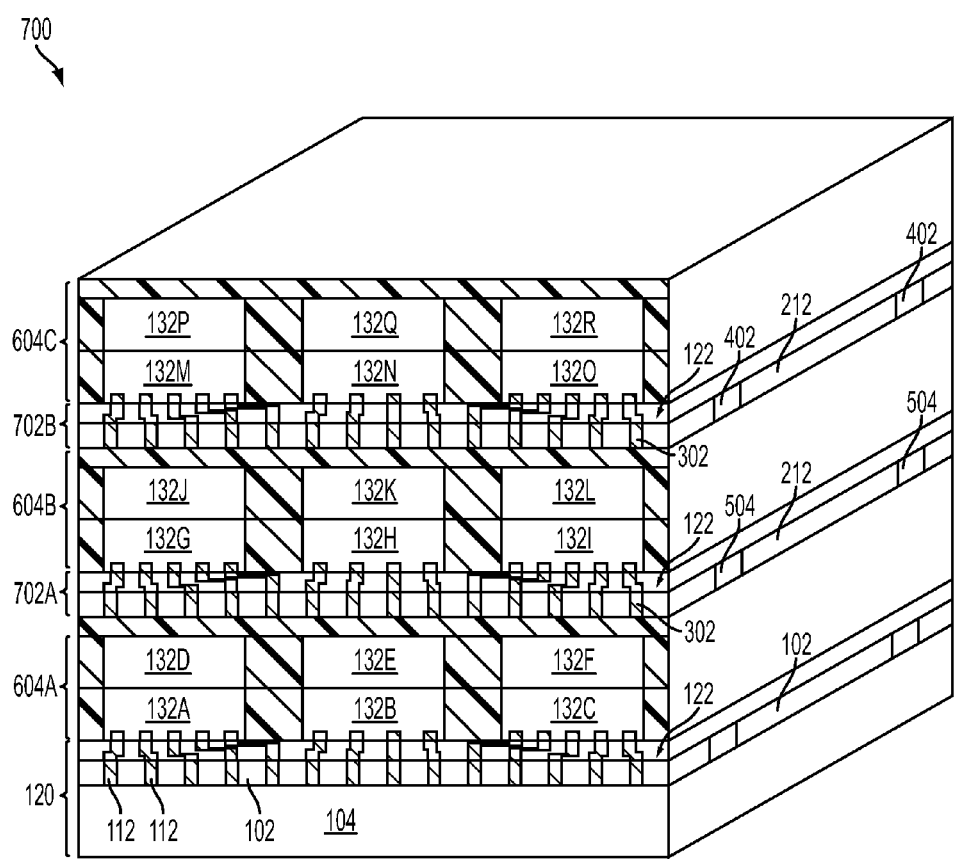
FIG. 7 is a simplified partially cutaway perspective view of another three-dimensionally integrated bonded semiconductor structure that may be formed using embodiments of the methods of the present invention, and that includes multiple layers of processed semiconductor structures with interconnect layers therebetween having two different types of interconnects therein.

For example, FIG. 7 illustrates a bonded semiconductor structure 700 that is similar to the bonded semiconductor structure 600 of FIG. 6 and includes a first layer 604A of processed semiconductor structures 132A-132F, a second layer 604B of processed semiconductor structures 132G-

132L, and a third layer 604C of processed semiconductor structures 132M-132R. A first inter-strata interconnect layer 702A is disposed between the first layer 604A of processed semiconductor structures 132A-132F and the second layer 604B of processed semiconductor structures 132G-132L, and a second inter-strata interconnect layer 702B is disposed between the second layer 604B of processed semiconductor structures 132G-132L and the third layer 604C of processed semiconductor structures 132M-132R.

Each of the interconnect layers 702A and 702B may comprise a transferred layer of material 212 as described hereinabove. As shown in FIG. 7, each of the interconnect layers 702A and 702B includes at least one electrical interconnect 302. The first interconnect layer 702A also includes fluidic interconnects 504, but does not include any optical interconnects 402. The second interconnect layer 702B includes optical interconnects 402, but does not include any fluidic interconnects 504. Such a configuration may be desirable in, for example, embodiments in which one or more of the processed semiconductor structures 132A-132L comprises a high powered semiconductor device, such as an electronic signal processor, and wherein one or more of the processed semiconductor structures 132M-132R comprises one or more optical devices, such as a laser, a light-emitting diode, or a photodiode.

The bonded semiconductor structure 700 also includes a substrate structure 120 as previously described herein, over which the first layer 604A of processed semiconductor structures 132A-132F are bonded. As previously discussed, the substrate structure 120 may comprise a relatively thin layer of material 102 over a relatively thick substrate body 104, with a plurality of through wafer interconnects 112 formed through the layer of material 102. Also, a redistribution layer 122 may be provided over the layer of material 102, as previously described herein. Although not shown in FIG. 7, in some embodiments, at least one optical interconnect 302 and/or at least one microfluidic interconnect 504 also may be formed in the relatively thin layer of material 102.

Additionally, as shown in FIG. 7, each of the interconnect layers 702A and 702B also may include a redistribution layer 122, which may be used to redistribute the electrical interconnects 302, optical interconnects 402, and fluidic interconnects 504.

After forming the bonded semiconductor structure 700 shown in FIG. 7, the bonded semiconductor structure 700 may be further processed as previously described in relation to the bonded semiconductor structure 320 with reference to FIGS. 2C through 2E, and in relation to the bonded semiconductor structure 420 with reference to FIGS. 3B and 3C.

Additional non-limiting example embodiments of the invention are described below.

Embodiment 1: A method of forming a bonded semiconductor structure, comprising: providing a substrate structure comprising a relatively thin layer of material on a relatively thick substrate body; forming a plurality of through wafer interconnects through the relatively thin layer of material of the first substrate structure; bonding a first processed semiconductor structure over the relatively thin layer of material of the first substrate structure on a side thereof opposite the relatively thick substrate body and electrically coupling at least one conductive feature of the first processed semiconductor structure with at least one through wafer interconnect of the plurality of through wafer interconnects; providing a transferred layer of material over the first processed semiconductor structure on a side thereof opposite the first substrate structure; forming at least one of an electrical interconnect, an optical interconnect, and a fluidic interconnect in the transferred layer of material; providing a second processed semiconductor structure over the transferred layer of material on a side thereof opposite the first processed semiconductor structure; removing the relatively thick substrate body of the substrate structure and leaving the relatively thin layer of material of the substrate structure bonded to the first processed semiconductor structure; and electrically coupling at least one through wafer interconnect of the plurality of through wafer interconnects to a conductive feature of another structure.

Embodiment 2: The method of Embodiment 1, wherein providing the substrate structure further comprises temporarily bonding the relatively thin layer of material to the relatively thick substrate body, and wherein removing the relatively thick substrate body of the substrate structure and leaving the relatively thin layer of material of the substrate structure bonded to the at least one processed semiconductor structure comprises separating the relatively thick substrate body from the relatively thin layer of material.

Embodiment 3: The method of Embodiment 1 or Embodiment 2, further comprising forming at least one redistribution layer over the relatively thin layer of material of the substrate structure on the side thereof opposite the relatively thick substrate body prior to bonding the first processed semiconductor structure over the relatively thin layer of material of the substrate structure, and wherein bonding the first processed semiconductor structure over the relatively thin layer of material of the substrate structure comprises bonding the first processed semiconductor structure to the redistribution layer.

Embodiment 4: The method of any of Embodiments 1 through 3, wherein bonding the first processed semiconductor structure over the relatively thin layer of material of the substrate structure comprises bonding the first processed semiconductor structure over the relatively thin layer of material of the substrate structure at a temperature or temperatures below about 400° C.

Embodiment 5: The method of any one of Embodiments 1 through 4, further comprising selecting the another structure to comprise a printed circuit board.

Embodiment 6: The method of any one of Embodiments 1 through 5, further comprising forming an additional plurality of through wafer interconnects through the first processed semiconductor structure after bonding the first processed semiconductor structure over the relatively thin layer of material of the substrate structure.

Embodiment 7: The method of any one of Embodiments 1 through 6, further comprising reusing the relatively thick substrate body of the substrate structure in a method of forming a bonded semiconductor structure.

Embodiment 8: The method of any one of Embodiments 1 through 7, wherein providing the transferred layer of material over the first processed semiconductor structure on the side thereof opposite the first substrate structure comprises: bonding an additional substrate structure comprising a semiconductor material over the first processed semiconductor structure on the side thereof opposite the first substrate structure; and forming the transferred layer of material to comprise at least a portion of the semiconductor material of the additional substrate structure.

Embodiment 9: The method of Embodiment 8, further comprising: implanting ions into the additional substrate structure along an ion implant plane; and fracturing the additional substrate structure along the ion implant plane after bonding the additional substrate structure over the first processed semiconductor structure.

Embodiment 10: The method of Embodiment 9, wherein fracturing the additional substrate structure along the ion implant plane comprises heating the additional substrate structure to a temperature or temperatures below about 400° C. to cause the additional substrate structure to fracture along the ion implant plane.

Embodiment 11: The method of any one of Embodiments 1 through 10, wherein forming at least one of an electrical interconnect, an optical interconnect, and a fluidic interconnect in the transferred layer of material comprises forming two or more of an electrical interconnect, an optical interconnect, and a fluidic interconnect in the transferred layer of material.

Embodiment 12: The method of any one of Embodiments 1 through 11, wherein forming at least one of an electrical interconnect, an optical interconnect, and a fluidic interconnect in the transferred layer of material comprises forming an additional plurality of through wafer interconnects through the transferred layer of material.

Embodiment 13: The method of Embodiment 12, further comprising electrically coupling at least one through wafer interconnect of the additional plurality of through wafer interconnects with a conductive feature of the second processed semiconductor structure.

Embodiment 14: The method of any one of Embodiments 1 through 11, wherein forming at least one of an electrical interconnect, an optical interconnect, and a fluidic interconnect in the transferred layer of material comprises forming at least one optical interconnect through the transferred layer of material.

Embodiment 15: The method of Embodiment 14, wherein the second processed semiconductor structure comprises at least one optical component, and wherein the method further comprises operatively coupling the at least one optical interconnect with the at least one optical component of the second processed semiconductor structure.

Embodiment 16: The method of any one of Embodiments 1 through 11, wherein forming at least one of an electrical interconnect, an optical interconnect, and a fluidic interconnect in the transferred layer of material comprises forming at least one fluidic interconnect in the transferred layer of material.

Embodiment 17: A bonded semiconductor structure, comprising: a substrate structure, comprising: a plurality of through wafer interconnects extending through a relatively thin layer of material; and a relatively thick substrate body bonded to the layer of material; a plurality of processed semiconductor structures electrically coupled to the plurality of through wafer interconnects on a side of the relatively thin layer of material opposite the relatively thick substrate body; a transferred layer of material over the first processed semiconductor structure on a side thereof opposite the substrate structure; and at least one of an electrical interconnect, an optical interconnect, and a fluidic interconnect in the transferred layer of material.

Embodiment 18: The bonded semiconductor structure of Embodiment 17, wherein the relatively thin layer of material has an average thickness of about one and one-half microns (1.5 um) or less.

Embodiment 19: The bonded semiconductor structure of Embodiment 17 or Embodiment 18, further comprising at least two of an electrical interconnect, an optical interconnect, and a fluidic interconnect in the transferred layer of material.

Embodiment 20: The bonded semiconductor structure of any one of Embodiments 17 through 19, further comprising at least one additional processed semiconductor structure over the transferred layer of material on a side thereof opposite the plurality of processed semiconductor structures.

Embodiment 21: The bonded semiconductor structure of Embodiment 20, wherein the at least one of an electrical interconnect, an optical interconnect, and a fluidic interconnect in the transferred layer of material is operatively coupled with the at least one additional processed semiconductor structure.

The example embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the invention. Such modifications and embodiments are also intended to fall within the scope of the appended claims.

What is claimed is:

1. A method of forming a bonded semiconductor structure, comprising:
    providing a substrate structure comprising a relatively thin layer of material on a relatively thick substrate body;
    forming a plurality of through wafer interconnects through the relatively thin layer of material of the substrate structure and forming an interconnect layer consisting essentially of the relatively thin layer of material and the plurality of through wafer interconnects;
    bonding a first processed semiconductor structure over the relatively thin layer of material of the substrate structure on a side thereof opposite the relatively thick substrate body and electrically coupling at least one conductive feature of the first processed semiconductor structure with at least one through wafer interconnect of the plurality of through wafer interconnects;
    providing a transferred layer of material over the first processed semiconductor structure on a side thereof opposite the substrate structure;
    forming at least one of an electrical interconnect, an optical interconnect, and a fluidic interconnect in the transferred layer of material;
    providing a second processed semiconductor structure over the transferred layer of material on a side thereof opposite the first processed semiconductor structure;
    removing the relatively thick substrate body of the substrate structure and leaving the relatively thin layer of material of the substrate structure bonded to the first processed semiconductor structure; and
    electrically coupling at least one through wafer interconnect of the plurality of through wafer interconnects to a conductive feature of another structure.

2. The method of claim 1, wherein providing the substrate structure further comprises temporarily bonding the relatively thin layer of material to the relatively thick substrate body, and wherein removing the relatively thick substrate body of the substrate structure and leaving the relatively thin layer of material of the substrate structure bonded to the at least one processed semiconductor structure comprises separating the relatively thick substrate body from the relatively thin layer of material.

3. The method of claim 1, further comprising forming at least one redistribution layer over the relatively thin layer of material of the substrate structure on the side thereof opposite the relatively thick substrate body prior to bonding the first processed semiconductor structure over the relatively thin layer of material of the substrate structure, and wherein bonding the first processed semiconductor structure over the relatively thin layer of material of the substrate structure comprises bonding the first processed semiconductor structure to the redistribution layer.

4. The method of claim 1, wherein bonding the first processed semiconductor structure over the relatively thin layer of material of the substrate structure comprises bonding the first processed semiconductor structure over the relatively thin layer of material of the substrate structure at a temperature or temperatures below about 400° C.

5. The method of claim 1, further comprising selecting the another structure to comprise a printed circuit board.

6. The method of claim 1, further comprising forming an additional plurality of through wafer interconnects through the first processed semiconductor structure after bonding the first processed semiconductor structure over the relatively thin layer of material of the substrate structure.

7. The method of claim 1, further comprising reusing the relatively thick substrate body of the substrate structure in a method of forming a bonded semiconductor structure.

8. The method of claim 1, wherein providing the transferred layer of material over the first processed semiconductor structure on the side thereof opposite the substrate structure comprises:
  bonding an additional substrate structure comprising a semiconductor material over the first processed semiconductor structure on the side thereof opposite the substrate structure; and
  forming the transferred layer of material to comprise at least a portion of the semiconductor material of the additional substrate structure.

9. The method of claim 8, further comprising:
  implanting ions into the additional substrate structure along an ion implant plane; and
  fracturing the additional substrate structure along the ion implant plane after bonding the additional substrate structure over the first processed semiconductor structure.

10. The method of claim 9, wherein fracturing the additional substrate structure along the ion implant plane comprises heating the additional substrate structure to a temperature or temperatures below about 400° C. to cause the additional substrate structure to fracture along the ion implant plane.

11. The method of claim 1, wherein forming at least one of an electrical interconnect, an optical interconnect, and a fluidic interconnect in the transferred layer of material comprises forming two or more of an electrical interconnect, an optical interconnect, and a fluidic interconnect in the transferred layer of material.

12. The method of claim 1, wherein forming at least one of an electrical interconnect, an optical interconnect, and a fluidic interconnect in the transferred layer of material comprises forming an additional plurality of through wafer interconnects through the transferred layer of material.

13. The method of claim 12, further comprising electrically coupling at least one though wafer interconnect of the additional plurality of through wafer interconnects with a conductive feature of the second processed semiconductor structure.

14. The method of claim 1, wherein forming at least one of an electrical interconnect, an optical interconnect, and a fluidic interconnect in the transferred layer of material comprises forming at least one optical interconnect through the transferred layer of material.

15. The method of claim 14, wherein the second processed semiconductor structure comprises at least one optical component, and wherein the method further comprises operatively coupling the at least one optical interconnect with the at least one optical component of the second processed semiconductor structure.

16. The method of claim 1, wherein forming at least one of an electrical interconnect, an optical interconnect, and a fluidic interconnect in the transferred layer of material comprises forming at least one fluidic interconnect in the transferred layer of material.

17. The method of claim 1, further comprising selecting the transferred layer of material to comprise a layer of semiconductor material.

18. The method of claim 17, wherein forming the at least one of an electrical interconnect, an optical interconnect, and a fluidic interconnect in the transferred layer of material comprises forming an interconnect layer comprising the layer of semiconductor material and the at least one of an electrical interconnect, an optical interconnect, and a fluidic interconnect in the layer of semiconductor material.

19. The method of claim 1, further comprising selecting the relatively thin layer of material to comprise a semiconductor material, and selecting the relatively thick substrate body to comprise a ceramic material.

20. The method of claim 19, further comprising selecting the relatively thin layer of material to comprise silicon or germanium, and selecting the relatively thick substrate body to comprise an oxide or a nitride.

21. The method of claim 1, further comprising selecting each of the relatively thin layer of material and the relatively thick substrate body to comprise a semiconductor material.

22. The method of claim 21, further comprising selecting the relatively thick substrate body to comprise silicon.

23. The method of claim 22, further comprising selecting the relatively thin layer of material to comprise silicon or germanium.

24. The method of claim 21, further comprising selecting the relatively thick substrate body to comprise silicon.

25. The method of claim 21, wherein providing the substrate structure comprising the relatively thin layer of material on the relatively thick substrate body further comprises selecting the substrate structure to include an oxide bonding layer between the relatively thin layer of material and the relatively thick substrate body.

26. The method of claim 21, further comprising selecting the relatively thin layer of material to have an average thickness of about twenty microns (20 µm) or less, and selecting the relatively thick substrate body to have an average thickness of at least about six hundred microns (600 µm).

27. The method of claim 1, further comprising selecting the relatively thin layer of material to have an average thickness of about twenty microns (20 µm) or less, and selecting the relatively thick substrate body to have an average thickness of at least about six hundred microns (600 µm).

28. The method of claim 1, wherein bonding the first processed semiconductor structure over the relatively thin layer of material of the substrate structure on the side thereof opposite the relatively thick substrate body comprises bonding a plurality of processed semiconductor structures over the relatively thin layer of material of the substrate structure on the side thereof opposite the relatively thick substrate body, the processed semiconductor structures of the plurality being disposed laterally beside one another along a common plane.

* * * * *